(12) United States Patent
Chen et al.

(10) Patent No.: US 12,183,751 B2
(45) Date of Patent: Dec. 31, 2024

(54) FLUORINE PASSIVATION IN A PIXEL SENSOR

(71) Applicant: Taiwan Semiconductor Manufacturing Company, Ltd., Hsinchu (TW)

(72) Inventors: Wei-Lin Chen, Tainan (TW); Chun-Hao Chou, Tainan (TW); Kuo-Cheng Lee, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 545 days.

(21) Appl. No.: 17/448,542

(22) Filed: Sep. 23, 2021

(65) Prior Publication Data

US 2022/0310686 A1 Sep. 29, 2022

Related U.S. Application Data

(60) Provisional application No. 63/166,070, filed on Mar. 25, 2021.

(51) Int. Cl.
*H01L 27/146* (2006.01)

(52) U.S. Cl.
CPC .... *H01L 27/14612* (2013.01); *H01L 27/1463* (2013.01); *H01L 27/14689* (2013.01)

(58) Field of Classification Search
CPC ........... H01L 27/14612; H01L 27/1463; H01L 27/14689

See application file for complete search history.

(56) References Cited

U.S. PATENT DOCUMENTS

| | | | | |
|---|---|---|---|---|
| 2006/0017132 A1* | 1/2006 | Birner | ............... | H01L 21/02351 |
| | | | | 257/E21.279 |
| 2007/0063217 A1* | 3/2007 | Brogan | ................. | H01L 29/872 |
| | | | | 257/E29.338 |
| 2011/0089513 A1* | 4/2011 | Endo | ................. | H01L 21/76237 |
| | | | | 438/57 |

(Continued)

FOREIGN PATENT DOCUMENTS

| | | | | |
|---|---|---|---|---|
| CN | 107919387 A | * | 4/2018 | |
| JP | 2006156954 A | * | 6/2006 | ..... H01L 21/823814 |

(Continued)

*Primary Examiner* — Eric K Ashbahian
*Assistant Examiner* — David W Ward
(74) *Attorney, Agent, or Firm* — Harrity & Harrity, LLP

(57) ABSTRACT

Implementations described herein reduce electron-hole pair generation due to silicon dangling bonds in pixel sensors. In some implementations, the silicon dangling bonds in a pixel sensor may be passivated by silicon-fluorine (Si—F) bonding in various portions of the pixel sensor such as a transfer gate contact via or a shallow trench isolation region, among other examples. The silicon-fluorine bonds are formed by fluorine implantation and/or another type of semiconductor processing operation. In some implementations, the silicon-fluorine bonds are formed as part of a cleaning operation using fluorine (F) such that the fluorine may bond with the silicon of the pixel sensor. Additionally, or alternatively, the silicon-fluorine bonds are formed as part of a doping operation in which boron (B) and/or another p-type doping element is used with fluorine such that the fluorine may bond with the silicon of the pixel sensor.

20 Claims, 25 Drawing Sheets

(56) References Cited

U.S. PATENT DOCUMENTS

| | | | | |
|---|---|---|---|---|
| 2012/0043589 A1* | 2/2012 | Nozaki | ............ | H01L 27/14616 |
| | | | | 257/225 |
| 2015/0340276 A1* | 11/2015 | Tsai | ................. | H01L 21/02252 |
| | | | | 438/703 |
| 2016/0343761 A1* | 11/2016 | Ishino | ................. | H01L 27/1463 |
| 2020/0411585 A1* | 12/2020 | Huang | ............. | H01L 27/14614 |
| 2021/0151487 A1* | 5/2021 | Zang | ................ | H01L 27/14614 |
| 2021/0305306 A1* | 9/2021 | Berger | ............. | H01L 27/14692 |
| 2022/0149088 A1* | 5/2022 | Im | ..................... | H01L 27/14621 |
| 2022/0254823 A1* | 8/2022 | Takahashi | ............. | H01L 27/146 |
| 2022/0301885 A1* | 9/2022 | Chen | ................ | H01L 21/28088 |
| 2022/0302198 A1* | 9/2022 | Kang | ................ | H01L 27/14831 |

FOREIGN PATENT DOCUMENTS

| | | | |
|---|---|---|---|
| KR | 20080008851 A | * | 1/2008 |
| WO | WO-2019206679 A1 | * | 10/2019 |

\* cited by examiner

FLUORINE PASSIVATION IN A PIXEL SENSOR

PRIORITY CLAIM AND CROSS-REFERENCE

This Patent Application claims priority to U.S. Provisional Patent Application No. 63/166,070, filed on Mar. 25, 2021, and entitled "FLUORINE PASSIVATION IN A PIXEL SENSOR." The disclosure of the prior application is considered part of and is incorporated by reference into this patent application.

BACKGROUND

Complementary metal oxide semiconductor (CMOS) image sensors utilize light-sensitive CMOS circuitry to convert light energy into electrical energy. The light-sensitive CMOS circuitry may include a photodiode formed in a silicon substrate. As the photodiode is exposed to light, an electrical charge is induced in the photodiode (and may be referred to as a "photocurrent"). The photodiode may be coupled to a switching transistor, which is used to sample the charge of the photodiode. Colors may be determined by placing filters over the light-sensitive CMOS circuitry.

Light received by pixel sensors of a CMOS image sensor is often based on the three primary colors: red, green, and blue (R, G, B). Pixel sensors that sense light for each color can be defined through the use of a color filter that allows the light wavelength for a particular color to pass into a photodiode. Some pixel sensors may be configured as white pixel sensors such that multiple colors of incident light are permitted through to the photodiode.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
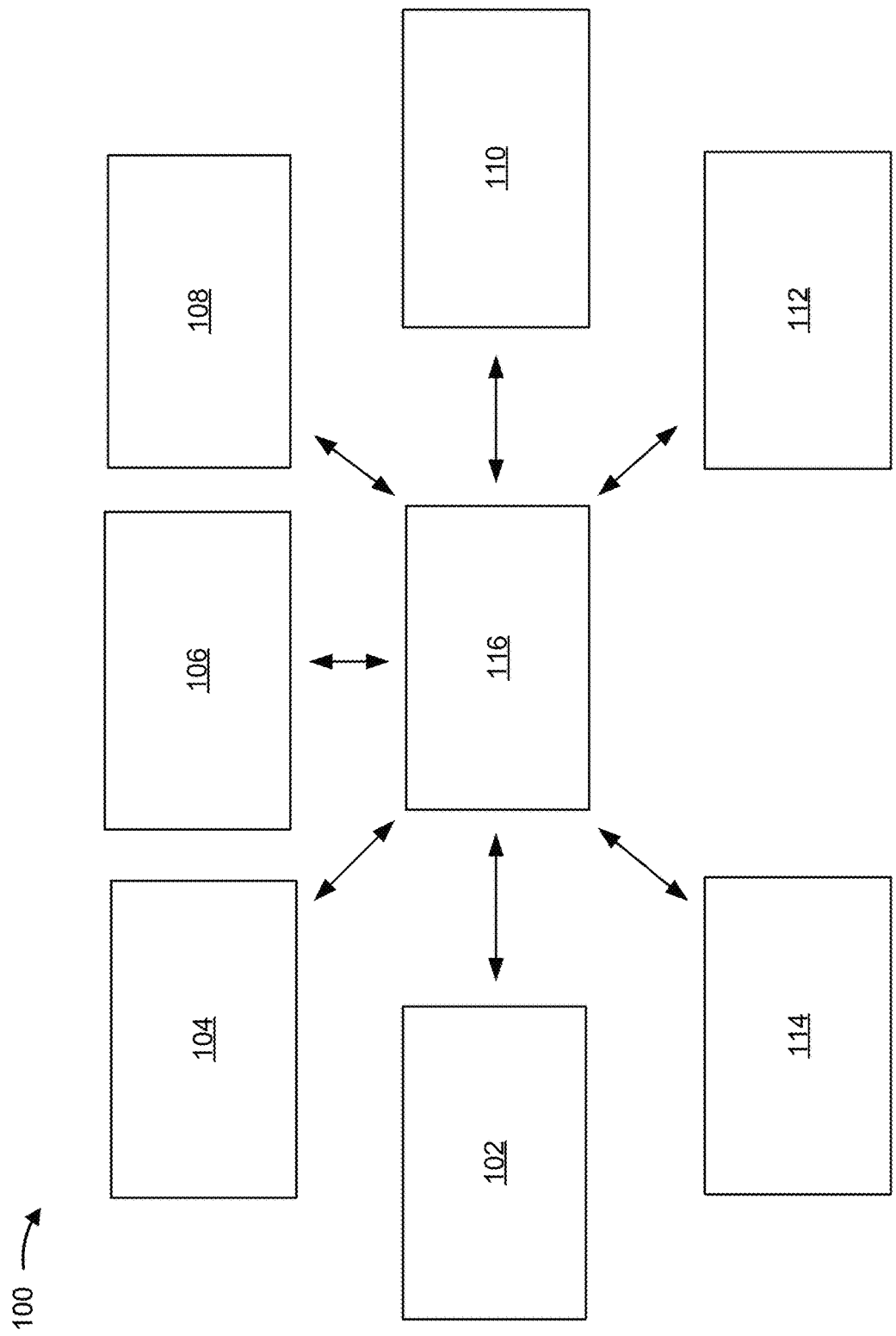
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, pixel sensors may experience dark current. Dark current is an electrical current that occurs in a pixel sensor as a result of an energy source other than incident light. Dark current may result from, for example, heat generated by an image sensor in which the pixel sensor is included and/or one or more other devices near the image sensor. Dark current can cause noise and other defects in images and/or video captured by the image sensor. For example, dark current can artificially increase the photocurrent generated by the pixel sensors included in the image sensor, which can cause some of the pixels in an image or a video to register as a white pixel or a hot pixel. In some cases, silicon (Si) dangling bonds at an interface between a silicon region and silicon oxide ($SiO_x$) region in a pixel sensor may decrease performance of the pixel sensor under dark current and/or white pixel conditions due to electron-hole pair generation at the silicon surface.

Some implementations described herein provide techniques and apparatuses for reducing electron-hole pair generation due to silicon dangling bonds in pixel sensors. In some implementations, the silicon dangling bonds in a pixel sensor may be passivated by silicon-fluorine (Si—F) bonding in various portions of the pixel sensor such as a transfer gate contact via (VTG) or a shallow trench isolation (STI) region, among other examples. The silicon-fluorine bonds may be formed by fluorine implantation and/or another type of semiconductor processing operation. In some implementations, the silicon-fluorine bonds are formed as part of a cleaning operation using fluorine (F) such that the fluorine may bond with the silicon of the pixel sensor. Additionally, or alternatively, the silicon-fluorine bonds are formed as part of a doping operation in which boron (B) and/or another p-type doping element is used with fluorine such that the fluorine may bond with the silicon of the pixel sensor.

As a result, the silicon-fluorine bond passivation increases performance of a pixel array under dark pixel and/or white pixel conditions without increasing the complexity of forming and/or processing the pixel array. As an example, the silicon-fluorine bond passivation may reduce dark current of the pixel array by approximately 13% or greater, may reduce dark signal non-uniformity (DSNU) of the pixel array by approximately 25% or greater, and/or may reduce white pixels in the pixel array by approximately 20% or greater.

FIG. 1 is a diagram of an example environment 100 in which systems and/or methods described herein may be implemented. The example environment 100 includes semiconductor processing tools that can be used to form semiconductor structures and devices, such as a pixel array or a pixel sensor with silicon-fluorine bonds as described herein.

As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool, such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or another type of exposure tool. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or another type of etch tool. In some implementations, the etch tool 108 includes a chamber that is filled with an etchant, and the substrate is placed in the chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The wafer/die transport tool 116 includes a mobile robot, a robot arm, a tram or rail car, an overhead hoist transfer (OHT) vehicle, an automated material handling system (AMHS), and/or another type of tool that is used to transport wafers and/or dies between semiconductor processing tools 102-114 and/or to and from other locations such as a wafer rack, a storage room, or another location. In some implementations, the wafer/die transport tool 116 is a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
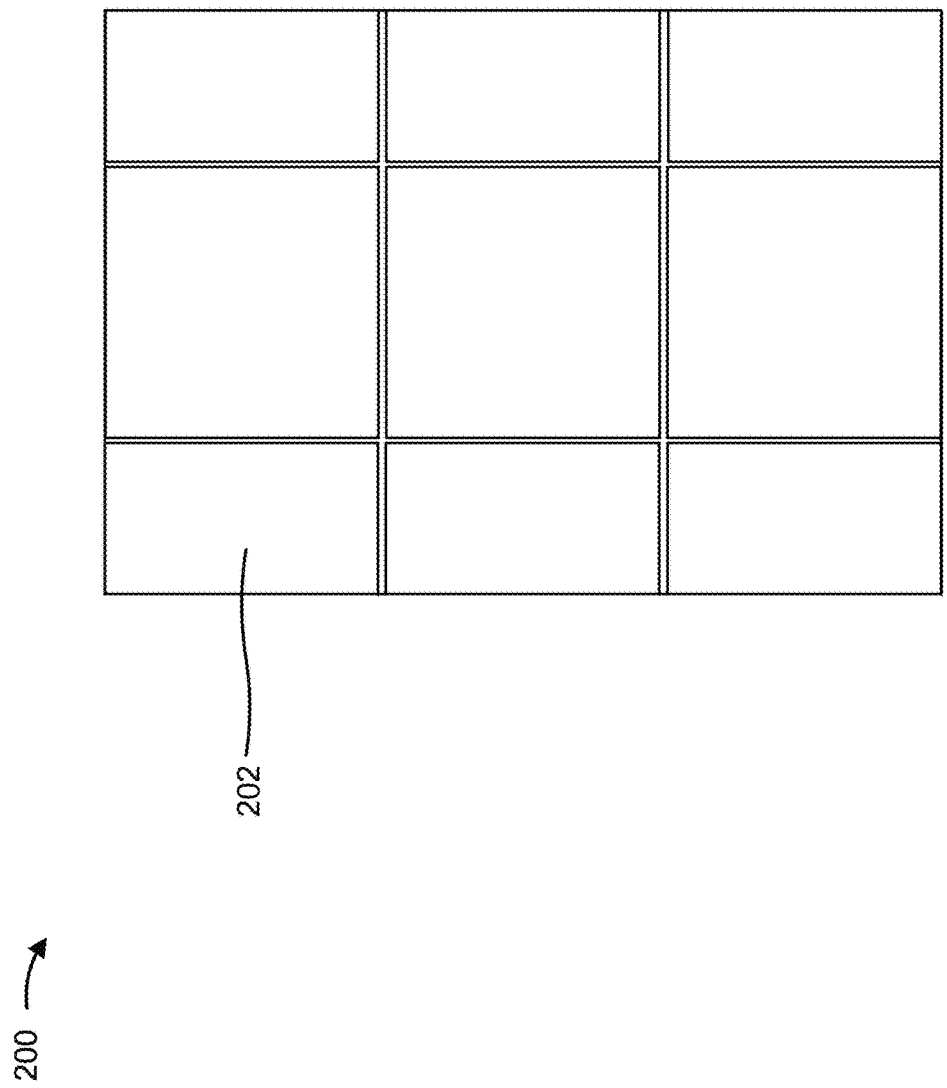
FIG. 2 is a diagram of an example pixel array described herein.

FIG. 2 is a diagram of an example pixel array 200 (or a portion thereof) described herein. The example pixel array 200 includes at least one pixel sensor with silicon-fluorine bonds as described herein.

The pixel array 200 may be included in an image sensor, such as a complementary metal oxide semiconductor (CMOS) image sensor, a back side illuminated (BSI) CMOS image sensor, or another type of image sensor. FIG. 2 shows a top-down view of the pixel array 200. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as circle shapes, octagon shapes, diamond shapes, and/or other similar shapes.

The pixel sensors 202 may be configured to sense and/or accumulate incident light (e.g., light directed toward the pixel array 200). For example, a pixel sensor 202 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal.

The number and arrangement of pixel sensors 202 shown in FIG. 2 are provided as one or more examples. In practice, there may be additional sensors, fewer sensors, or differently arranged sensors than those shown in FIG. 2.

Figure 3A:
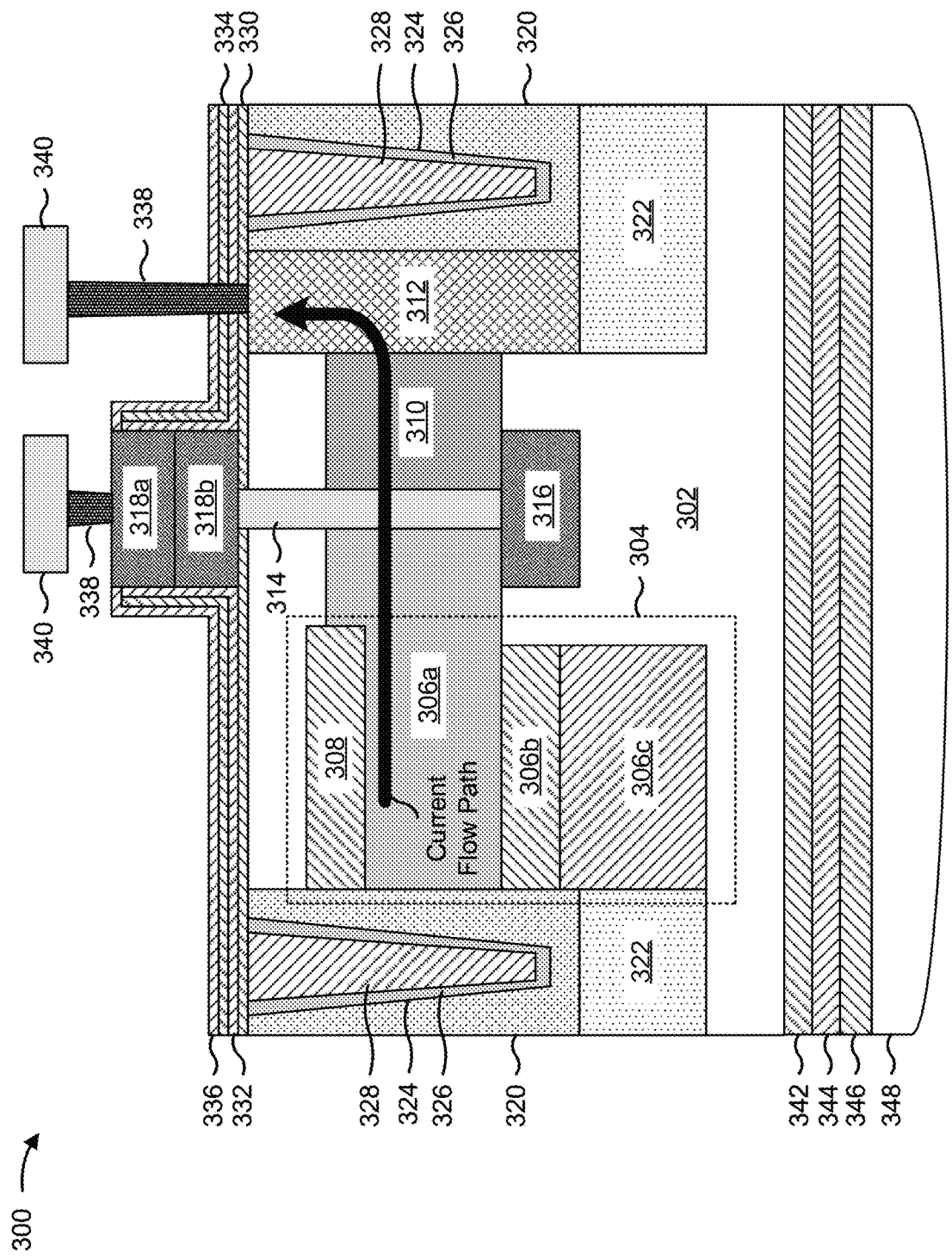
FIGS. 3A-3C are diagrams of example semiconductor structures described herein.
Figure 3B:
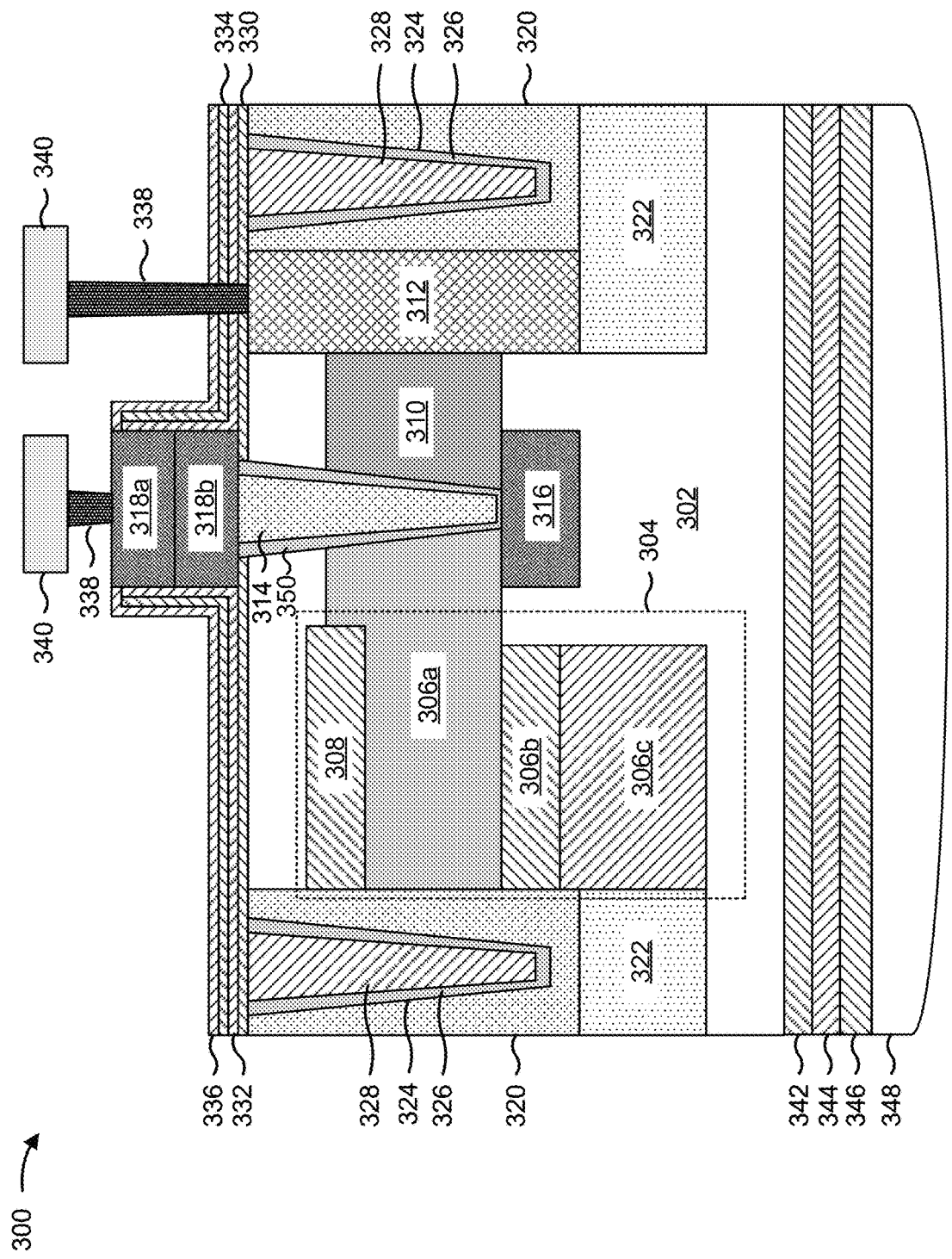
Figure 3C:
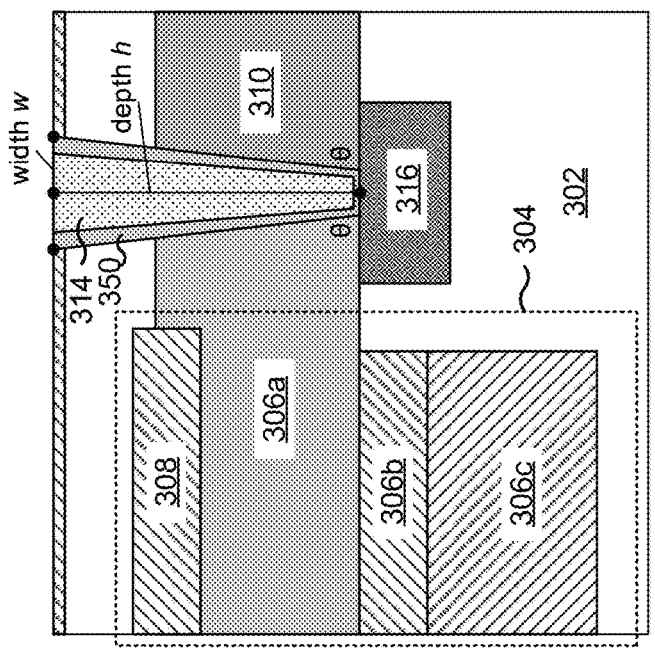

FIGS. 3A-3C are diagrams of an example pixel sensor 300 described herein. The pixel sensor 300 includes a transfer gate contact configured to transfer a photocurrent from a photodiode region of the pixel sensor 300 to a drain region of the pixel sensor 300, where an interface between the transfer gate contact and the photodiode region includes silicon-fluorine bonds that reduce dark current in the pixel sensor 300.

In some implementations, the pixel sensor 300 is configured as and/or may implement a pixel sensor 202 and be included in the pixel array 200. In some implementations, the pixel sensor 300 is included in an image sensor. The image sensor may be a CMOS image sensor, a BSI CMOS image sensor, or another type of image sensor.

FIG. 3A illustrates a cross-section view of the pixel sensor 300. As shown in FIG. 3A, the pixel sensor 300 may include a substrate 302. The substrate 302 may include a semiconductor die substrate, a semiconductor wafer, or another type of substrate in which semiconductor pixels may be formed. In some implementations, the substrate 302 is formed of silicon (Si) (e.g., a silicon substrate), a material including silicon, a III-V compound semiconductor material such as gallium arsenide (GaAs), a silicon on insulator (SOI), or another type of semiconductor material that is capable of generating a charge from photons of incident light. In some implementations, the substrate 302 is formed of a doped material (e.g., a p-doped material or an n-doped material), such as a doped silicon.

The pixel sensor 300 may include a photodiode region 304 included in the substrate 302. The photodiode region 304 may include a plurality of layers that are doped with various types of ions to form a p-n junction or a PIN junction (e.g., a junction between a p-type portion, an intrinsic (or undoped) type portion, and an n-type portion). For example, the substrate 302 may be doped with an n-type dopant to form one or more n-type layers 306 of the photodiode region 304, and the substrate 302 may be doped with a p-type dopant to form a p-type layer 308 of the photodiode region 304. The photodiode region 304 may be configured to absorb photons of incident light. The absorption of photons causes the photodiode region 304 to accumulate a charge (also referred to as a "photocurrent") due to the photoelectric effect. For example, photons may bombard the photodiode region 304, which causes emission of electrons in the photodiode region 304.

The layers included in the photodiode region 304 may be stacked and/or vertically arranged. For example, the p-type layer 308 may be included over the one or more n-type layers 306. The p-type layer 308 may provide noise isolation for the one or more n-type layers 306 and may facilitate photocurrent generation in the photodiode region 304. The p-type layer 308 (and thus, the photodiode region 304) may be spaced away (e.g., downward) from a top surface of the substrate 302 to provide noise isolation and/or light-leakage isolation from one or more upper layers of the pixel sensor 300. The gap between the top surface of the substrate 302 and the p-type layer 308 decreases charging of the pixel sensor 300, decreases the likelihood of plasma damage to the photodiode region 304, and/or reduces the dark current of the pixel sensor 300 and/or the white pixel performance of the pixel sensor 300, among other examples.

The one or more n-type layers 306 may include an n-type layer 306a, an n-type layer 306b, and an n-type layer 306c. The n-type layer 306b may be located over and/or on the n-type layer 306c, and the n-type layer 306a may be located over and/or on the n-type layer 306b. The n-type layer 306b and the n-type layer 306c may be referred to as "deep n-type layers" or "deep n-wells" and may extend the n-type layer 306 of the photodiode region 304. Extending the n-type layer 306 of the photodiode region 304 provides an increased area for photon absorption in the photodiode region 304, which increases the sensitivity of the pixel sensor 300. Moreover, at least a subset of the one or more n-type layers 306 may have different doping concentrations. For example, the n-type region 306a may include a greater n-type dopant concentration relative to the n-type region 306b, and the n-type region 306c, and the n-type region 306b may include a greater n-type dopant concentration relative to the n-type region 306c. As a result, an n-type dopant gradient is formed, which may increase the migration of electrons upward in the photodiode 304.

The pixel sensor 300 may include a drain extension region 310 and a drain region 312 coupled and/or electrically connected to the drain extension region 310. The drain extension region 310 and/or the drain region 312 may also be referred to as a "floating diffusion region." The drain extension region 310 may be adjacent to the drain region 312. The drain region 312 may include a highly-doped n-type region (e.g., an n+ doped region). The drain extension region 310 may include one or more lightly-doped n-type regions that facilitate the transfer of photocurrent from the n-type layer 306a to the drain region 312. The drain extension region 310 may be spaced away (e.g., downward) from a top surface of the substrate 302 to provide noise isolation and/or light-leakage isolation from one or more upper layers of the pixel sensor 300. The gap between the top surface of the substrate 302 and the drain extension region 310 increases noise isolation for the drain extension region 310, decreases random noise and/or random telegraph noise in the pixel sensor 300, decreases the likelihood of plasma damage to the drain extension region 310, and/or reduces the dark current of the pixel sensor 300 and/or the white pixel performance of the pixel sensor 300, among other examples.

The pixel sensor 300 may include a transfer gate contact 314 to control the transfer of photocurrent between the photodiode region 304 and the drain region 312. The transfer gate contact 314 may be energized (e.g., by applying a voltage or a current to the transfer gate contact 314) to cause a conductive channel to form between the photodiode region 304 and the drain extension region 310. The conductive channel may be removed or closed by de-energizing the transfer gate contact 314, which blocks and/or prevents the flow of photocurrent between the photodiode region 304 and the drain region 312. In some implementations, a p-type region 316 is included below the transfer gate contact 314 to provide electrical isolation between the transfer gate contact 314, the substrate 302, and/or other regions of the pixel sensor 300. Accordingly, the p-type region 316 decreases risks of an electrical short at the transfer gate contact 314 and/or reduces the dark current within the pixel sensor 300, among other examples.

In some implementations, the transfer gate contact 314 includes fluorine bonded to silicon at an interface between the transfer gate contact 314 and the substrate 302. Dangling silicon bonds at the interface result in unoccupied band gaps between approximately −1 electron Volt (eV) and 1 eV. Accordingly, valence electrons from the silicon atoms may move to the unoccupied band gaps and form electron-hole pairs, which results in dark current flowing from the transfer gate contract 314 to the drain extension region 310 and/or the drain region 312. This dark current artificially increases the photocurrent, which can cause the pixel sensor 300 to register as a white pixel or a hot pixel. The fluorine bonded to the silicon at least partially fills these unoccupied band gaps such that fewer valence electrons from the silicon atoms may move to the unoccupied band gaps.

The transfer gate contact 314 may be coupled and/or electrically connected to a gate electrode stack 318 including an n-doped upper transfer gate electrode region 318a and a transfer gate electrode 318b. The transfer gate electrode 318b may be included over a portion of the top surface of the substrate 302, and the n-doped upper transfer gate electrode region 318a may be located over and/or on the transfer gate electrode 318b. The n-doped upper transfer gate electrode region 318a may include a layer of n$^+$ doped polysilicon. The transfer gate electrode 318b may include a layer of polysilicon.

The pixel sensor 300 may include a plurality of regions to provide electrical isolation and/or optical isolation between the pixel sensor 300 and adjacent pixel sensors. In some implementations, the pixel sensor 300 includes a cell p-well region (CPW) 320 and a deep p-well region (DPW) 322 that surround the photodiode 304, the drain extension region 310, the drain region 312, the transfer gate contact 314, and the p-type region 316. The cell p-well region 320 and the deep p-well region 322 may include a circle or ring shape in a top-down view in the substrate 302. In some implementations, the cell p-well region 320 and the deep p-well region 322 each includes a p$^+$ doped silicon material or another p$^+$ doped material. The cell p-well region 320 may be included over and/or on the deep p-well region 322.

An isolation structure 324 (e.g., a deep trench isolation (DTI) structure, a shallow trench isolation (STI) structure) may be included in the cell p-well region 320. In some implementations, the isolation structure 324 includes one or more trenches that extend downward into the cell p-well region 320 and surround the photodiode 304, the drain extension region 310, the drain region 312, the transfer gate contact 314, and the p-type region 316. The isolation structure 324 provides optical isolation between the pixel sensor 300 and one or more adjacent pixel sensors to reduce the amount of optical crosstalk between the pixel sensor 300 and the one or more adjacent pixel sensors. In particular, the isolation structure 324 may absorb, refract, and/or reflect incident light, which may reduce the amount of incident light that travels through a pixel sensor 300 into an adjacent pixel sensor and is absorbed by the adjacent pixel sensor.

In some implementations, the isolation structure 324 includes fluorine bonded to silicon at an interface between the isolation structure 324 and the substrate 302. Dangling silicon bonds at the interface result in unoccupied band gaps between approximately −1 eV and 1 eV. Accordingly, valence electrons from the silicon atoms may move to the unoccupied band gaps and form electron-hole pairs, which results in dark current flowing from the isolation structure 324 to the drain extension region 310 and/or the drain region 312. Additionally, or alternatively, the dark current may flow from the pixel sensor 300 to an adjacent pixel sensor. This dark current artificially increases the photocurrent, which can cause the pixel sensor 300 (or an adjacent pixel sensor) to register as a white pixel or a hot pixel. The fluorine bonded to the silicon at least partially fills these unoccupied band gaps such that fewer valence electrons from the silicon atoms may move to the unoccupied band gaps.

In some implementations, a field implant layer (FIL) 326 is included on the sidewalls and on the bottom surface of the isolation structure 324. The field implant layer 326 may include, for example, silicon germanium, doped silicon, or another type of material that protects other portions of the pixel sensor 300 from damage during formation and/or filling of the isolation structure 324, and/or repairs other portions of the pixel sensor 300 resulting from formation of the isolation structure 324.

In some implementations, an oxide layer 328 is included in the isolation structure 324 over and/or on the field implant layer 326. The oxide layer 328 may function to reflect incident light toward the photodiode 304 to increase the quantum efficiency of the pixel sensor 300 and to reduce optical crosstalk between the pixel sensor 300 and one or more adjacent pixel sensors. In some implementations, the oxide layer 328 includes an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another type of dielectric material is used in place of the oxide layer 328.

A gate dielectric layer 330 may be included above and/or over the top surface of the substrate 302, and above and/or over the cell p-well region 320. The transfer gate electrode 318b may be included over and/or on the gate dielectric layer 330. The gate dielectric layer 330 may include a dielectric material such as tetraethyl orthosilicate (TEOS) or another type of dielectric material. A sidewall oxide layer 332 may be included over and/or on the gate dielectric layer 330 on the top surface of the substrate 302. The sidewall oxide layer 332 may also be included on sidewalls of the n-doped upper transfer gate electrode region 318a and/or on sidewalls of the transfer gate electrode 318b. The sidewall oxide layer 332 may include an oxide such as silicon oxide ($SiO_x$) or another type of oxide material. A remote plasma oxide (RPO) layer 334 may be included over and/or on the sidewall oxide layer 332 over the top surface of the substrate 302. The remote plasma oxide layer 334 may also be included over the sidewall oxide layer 332 on the sidewalls of the n-doped upper transfer gate electrode region 318a and/or over the sidewall oxide layer 332 on the sidewalls of the transfer gate electrode 318b. A contact etch stop layer (CESL) 336 may be included over and/or on the remote plasma oxide layer 334 over the top surface of the substrate 302. The contact etch stop layer 336 may also be included over the remote plasma oxide layer 334 on the sidewalls of the n-doped upper transfer gate electrode region 318a and/or over remote plasma oxide layer 334 on the sidewalls of the transfer gate electrode 318b.

In some implementations, the transfer gate contact 314 and the drain region 312 are electrically connected by interconnects 338 (e.g., contact plugs, vias, trenches) with a metallization layer 340 above the substrate 302. The metallization layer 340 may be electrically connected to the transfer gate contact 314 by a first interconnect 338, and to the drain region 312 by a second interconnect 338. The first interconnect layer 338 may be electrically connected with the transfer gate contact 314 through the n-doped upper transfer gate electrode region 318a and the transfer gate electrode 318b. In some implementations, the interconnects 338 are included in a dielectric layer. The dielectric layer may include an inter-metal dielectric (IMD) layer formed of an oxide material such as a silicon oxide ($SiO_x$) (e.g., silicon dioxide ($SiO_2$)), a silicon nitride ($SiN_x$), a silicon carbide ($SiC_x$), a titanium nitride ($TiN_x$), a tantalum nitride ($TaN_x$), a hafnium oxide ($HfO_x$), a tantalum oxide ($TaO_x$), or an aluminum oxide ($AlO_x$), or another type of dielectric material. The interconnects 338 be filled with a conductive material, such as tungsten, cobalt, ruthenium, and/or another type of conductive material.

FIG. 3A illustrates an example current flow path (e.g., a photocurrent flow path) through the pixel sensor 300. As shown in FIG. 3A, a photocurrent generated by photons of incident light absorbed in the photodiode 304 may originate in the one or more n-type regions 306. A current (or voltage) may be applied to the transfer gate contact 314 from the metallization layer 340 through an interconnect 338, the n-doped upper transfer gate electrode region 318a, and the transfer gate electrode 318b. The current (or voltage) may energize the transfer gate contact 314, which causes an electric field to form a conductive channel between the n-type region 306a and the drain extension region 310. The photocurrent may travel along the conductive channel from the n-type region 306a to the drain extension region 310. The photocurrent may travel from the drain extension region 310 to the drain region 312. The photocurrent may be measured through another interconnect 338 at the metallization layer 340.

As described above, the pixel sensor 300 may be included in a BSI CMOS image sensor. Accordingly, the pixel sensor 300 may include one or more layers on a back side or a bottom side of the substrate 302. On the substrate 302, $p^+$ ion layer 342 may be included to increase photon-electron conversion. An antireflective coating (ARC) layer 344 may be included above and/or on the $p^+$ ion layer 342. The ARC 344 may include a suitable material for reducing a reflection of incident light projected toward the photodiode 304. For example, the ARC 344 may include nitrogen-containing material.

A color filter layer 346 may be included above and/or on the ARC 344. In some implementations, the color filter layer 346 includes a visible light color filter configured to filter a particular wavelength or a particular wavelength range of visible light (e.g., red light, blue light, or green light). In some implementations, the color filter layer 346 includes a near infrared (NIR) filter (e.g., an NIR bandpass filter) configured to permit wavelengths associated with NIR light to pass through the color filter layer 346 and to block other wavelengths of light. In some implementations, the color filter layer 346 includes an NIR cut filter configured to block NIR light from passing through the color filter layer 346. In some implementations, the color filter layer 346 is omitted from the pixel sensor 300 to permit all wavelengths of light to pass through to the photodiode 304. In these examples, the pixel sensor 300 may be configured as a white pixel sensor.

In some implementations, a micro-lens layer 348 is included above and/or on the color filter layer 346. The micro-lens layer 348 may include a micro-lens for the pixel sensor 300 configured to focus incident light toward the photodiode 304 and/or to reduce optical crosstalk between the pixel sensor 300 and one or more adjacent pixel sensors.

FIG. 3B illustrates a cross-section view of the pixel sensor 300. FIG. 3B is similar to FIG. 3A but includes a transfer gate contact 314 that extends deeper into the substrate 302 and that includes sloped sidewalls such that a top surface of the transfer gate contact 314 is wider than a bottom surface of the transfer gate contact 314. For example, the transfer gate contact 314 may be in a range of approximately 200 nanometers (nm) deep to approximately 600 nm deep. By selecting a depth of at least 200 nm, the transfer gate contact 314 facilitates photocurrent flow for a smaller pixel, such as when a size of the pixel sensor 300 is in a range of approximately 0.1 micrometers (μm) to 1.0 μm. Selecting a depth no more than 600 nm may maintain a sensitivity of the pixel sensor 300 by removing less volume from the substrate 302 in order to accommodate the transfer gate contact 314.

As further shown in FIG. 3B, in some implementations, the transfer gate contact 314 includes an oxide layer 350. In some implementations, the oxide layer 350 includes an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another type of dielectric material is used in place of the oxide layer 350. In some implementations, the oxide layer 350 is a few dozen Ångströms thick. For example, the oxide layer 350 may have a thickness in a range of approximately 1 Ångström to approximately 96 Ångströms. By selecting a thickness of at least 1 Ångström, the oxide layer 350 insulates polysilicon fill of the transfer gate contact 314 and prevent leakage current. Selecting a thickness of more than 96 Ångströms may provide too much insulation such that the transfer gate contact 314 does not properly receive photocurrent from the photodiode region 304.

The fluorine-silicon bonds may be formed before the oxide layer 350 is deposited. Accordingly, the fluorine may bond with silicon atoms that are in a range of approximately 0 nm to approximately 500 nm beneath a surface of the transfer gate contact 314. Selecting a depth no more than 500 nm may reduce dark current without saturating fluorine, which would cause the fluorine to at least partially embed in the photodiode region 304 and/or the drain extension region 310. By not saturating the pixel sensor 300 with fluorine, the electrical performance of the pixel sensor 300 is increased.

FIG. 3C illustrates a portion of the pixel sensor. FIG. 3C illustrates the transfer gate contact 314 with a depth represented by h and a width represented by w. Although depicted as including the oxide layer 350, the depth may extend from a top surface of the transfer gate contact 314 to a bottom surface of the transfer gate contact 314 excluding the oxide layer 350. Similarly, although depicted as including the oxide layer 350, the width may span sidewalls of the transfer gate contact 314 excluding the oxide layer 350. An aspect ratio of the depth to the width may be in a range of approximately 3 to approximately 6. By selecting an aspect ratio of at least 3, the transfer gate contact 314 amplifies photocurrent flow by moving the current from a larger surface area associated with the depth to a smaller surface area associated with the width. Selecting an aspect ratio of no more than 6 may prevent the transfer gate contact 314 from reaching saturation current such that the pixel sensor 300 no longer functions properly.

As further shown in FIG. 3C, the transfer gate contact 314 may be formed with sloped side surfaces such that an angle (e.g., represented by θ), formed relative to a side wall of the transfer gate contact 314 and a bottom surface of the drain extension region 310 (or the n-type layer 306a) is within a range of approximately 70 degrees to approximately 90 degrees. By selecting an angle of at least 70 degrees, the transfer gate contact 314 is not formed with too small of an aspect ratio (e.g., as described above). Selecting an angle of less than 90 degrees may prevent the oxide layer 350 from leaking such that the transfer gate contact 314 can no longer be activated and deactivated. Accordingly, a bottom surface of the transfer gate contact 314 may include a larger concentration of fluorine than sidewalls of the transfer gate contact 314 as a result of the angle.

As indicated above, FIGS. 3A-3C are provided as one or more examples. Other examples may differ from what is described with regard to FIGS. 3A-3C.

Figure 4A:
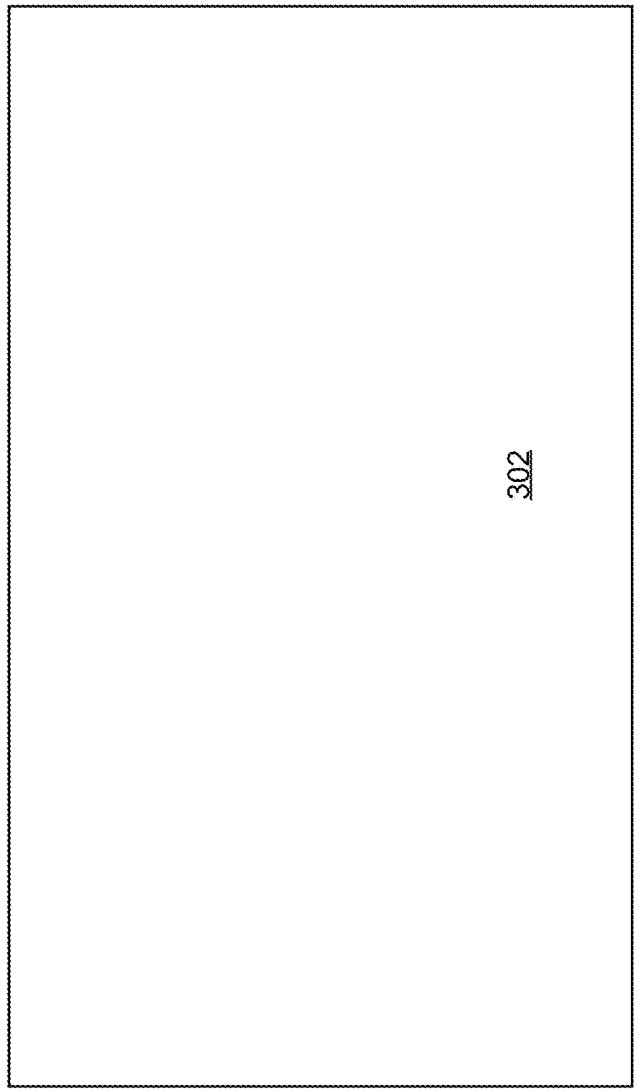
FIGS. 4A-4Q are diagrams of an example implementation described herein.
Figure 4A:
Figure 4B:
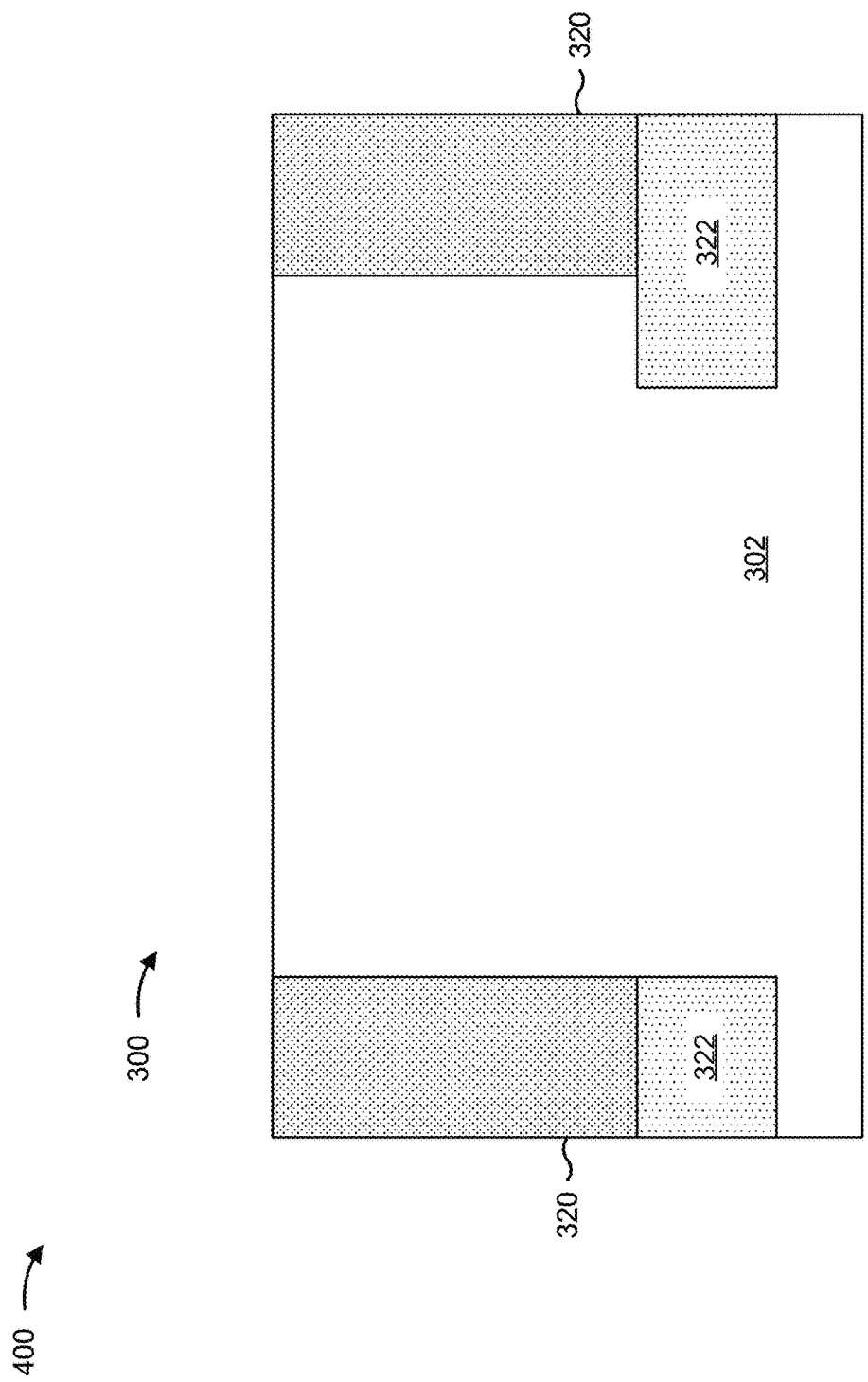
Figure 4C:
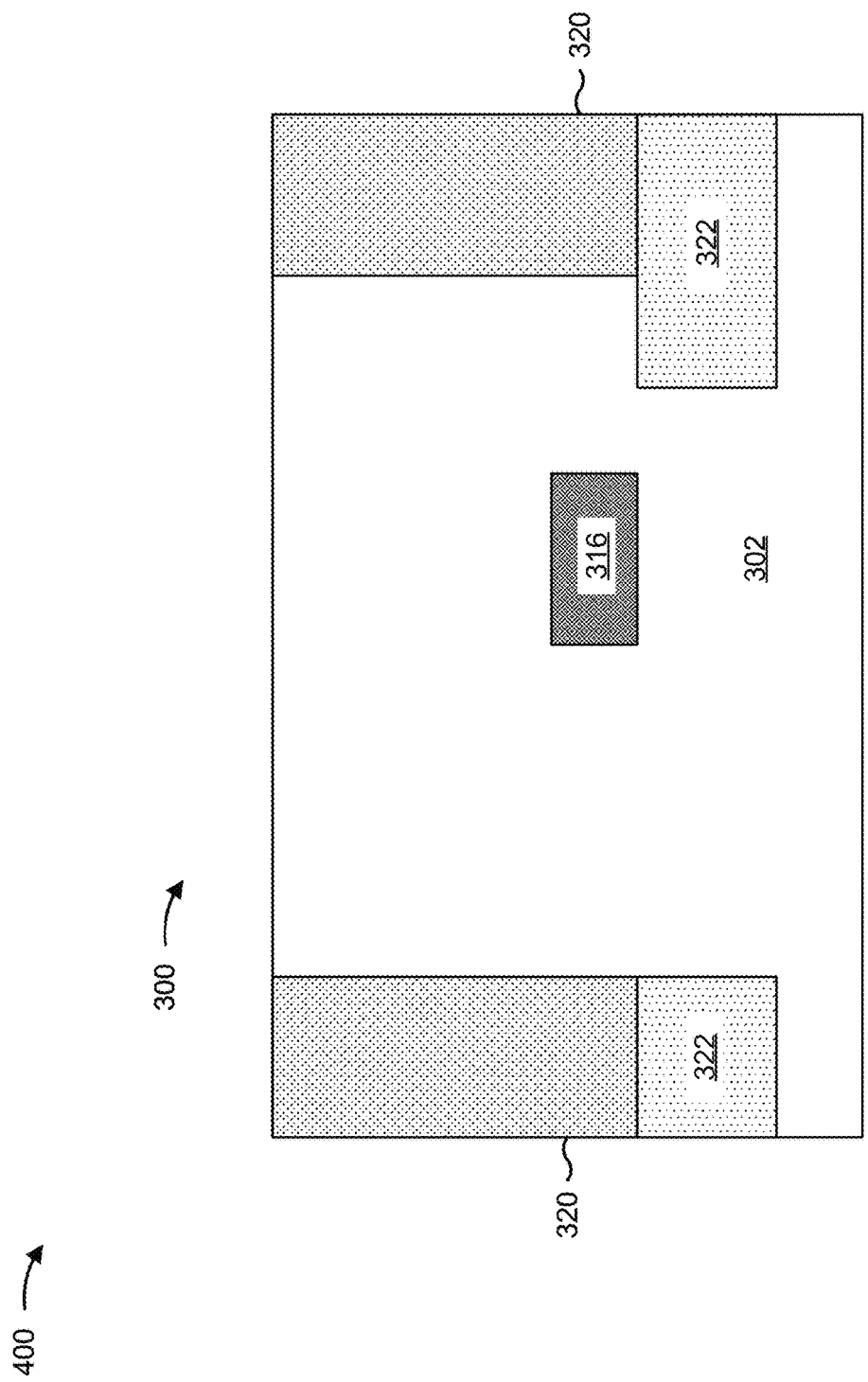
Figure 4D:
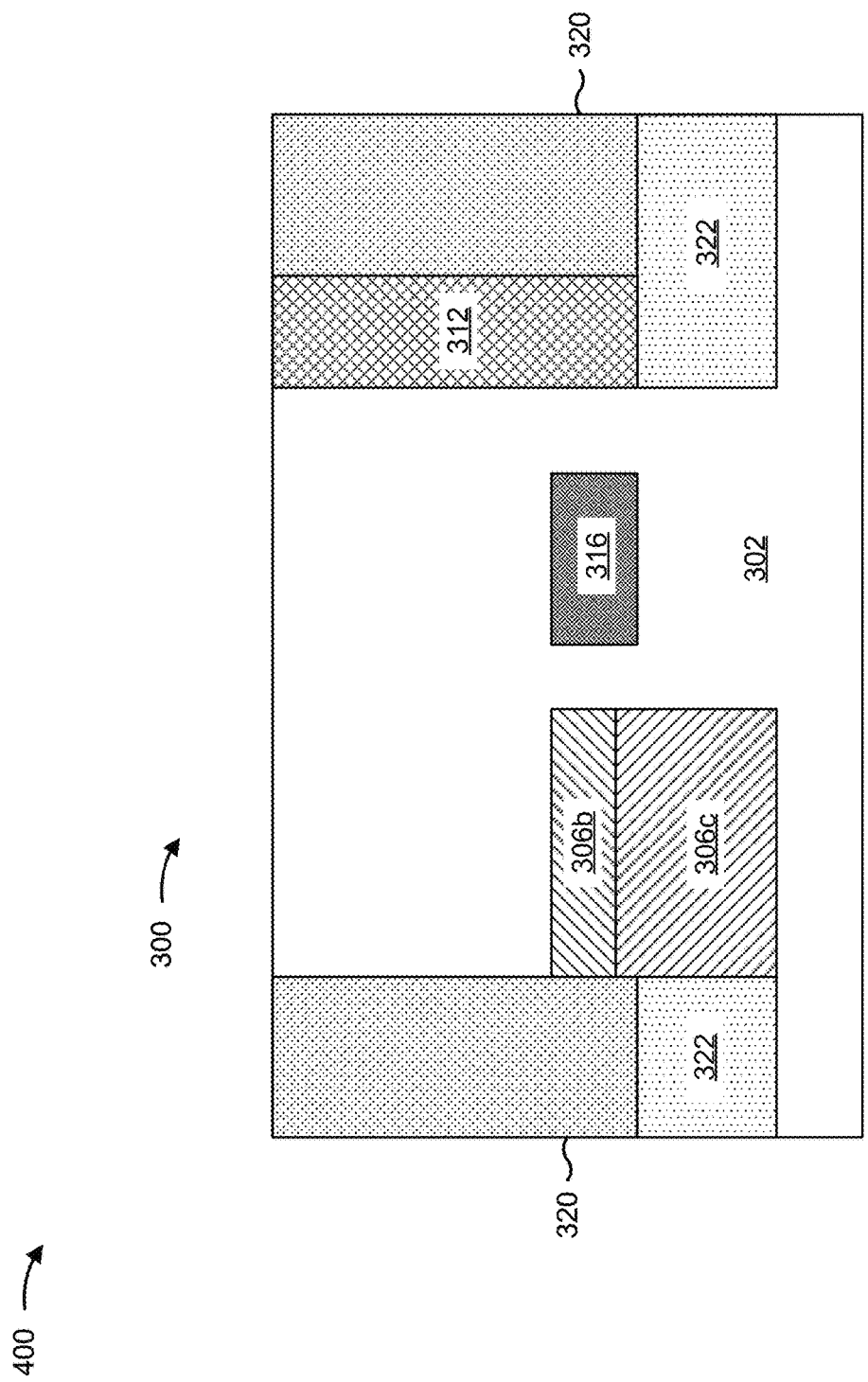
Figure 4E:
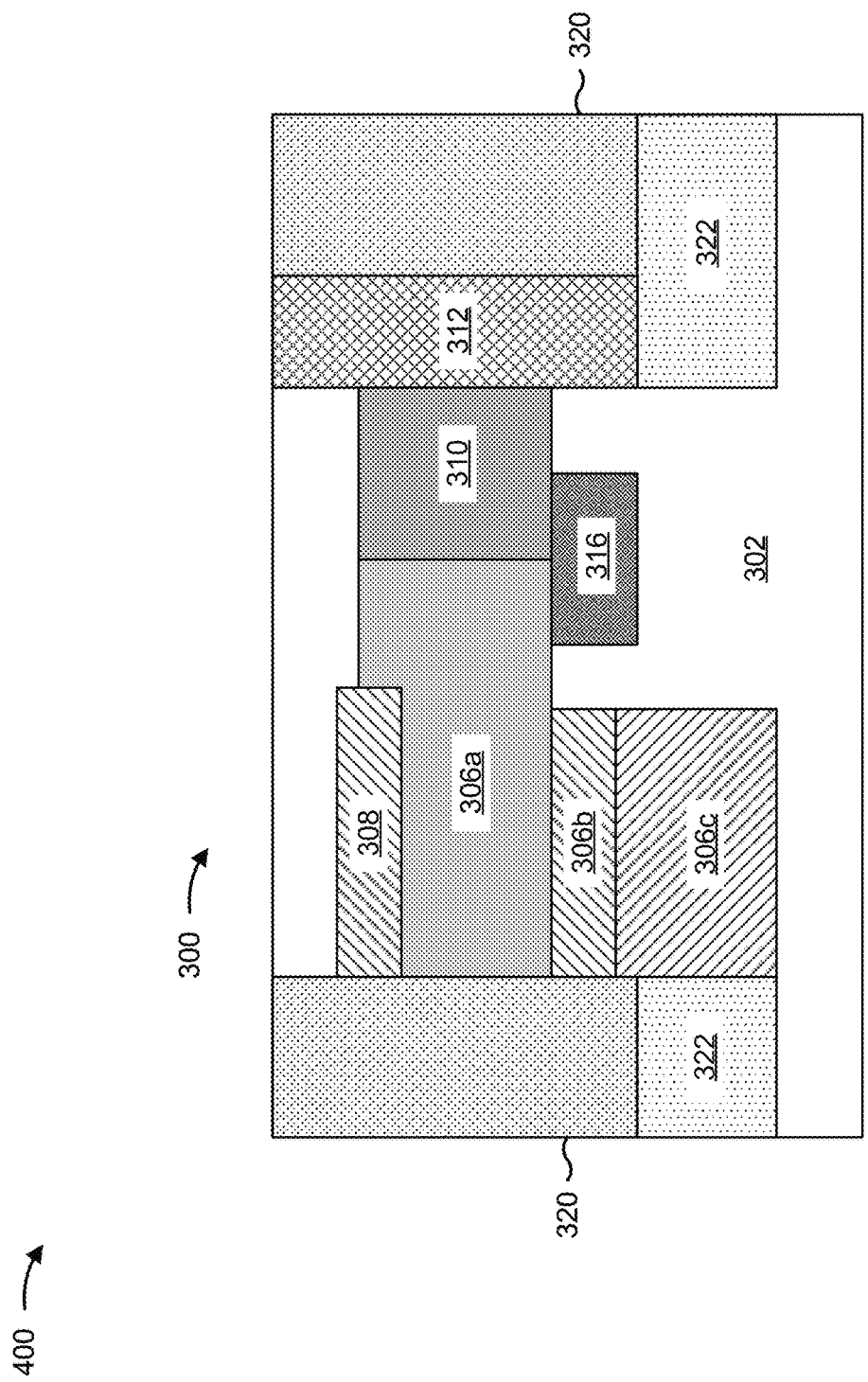
Figure 4F:
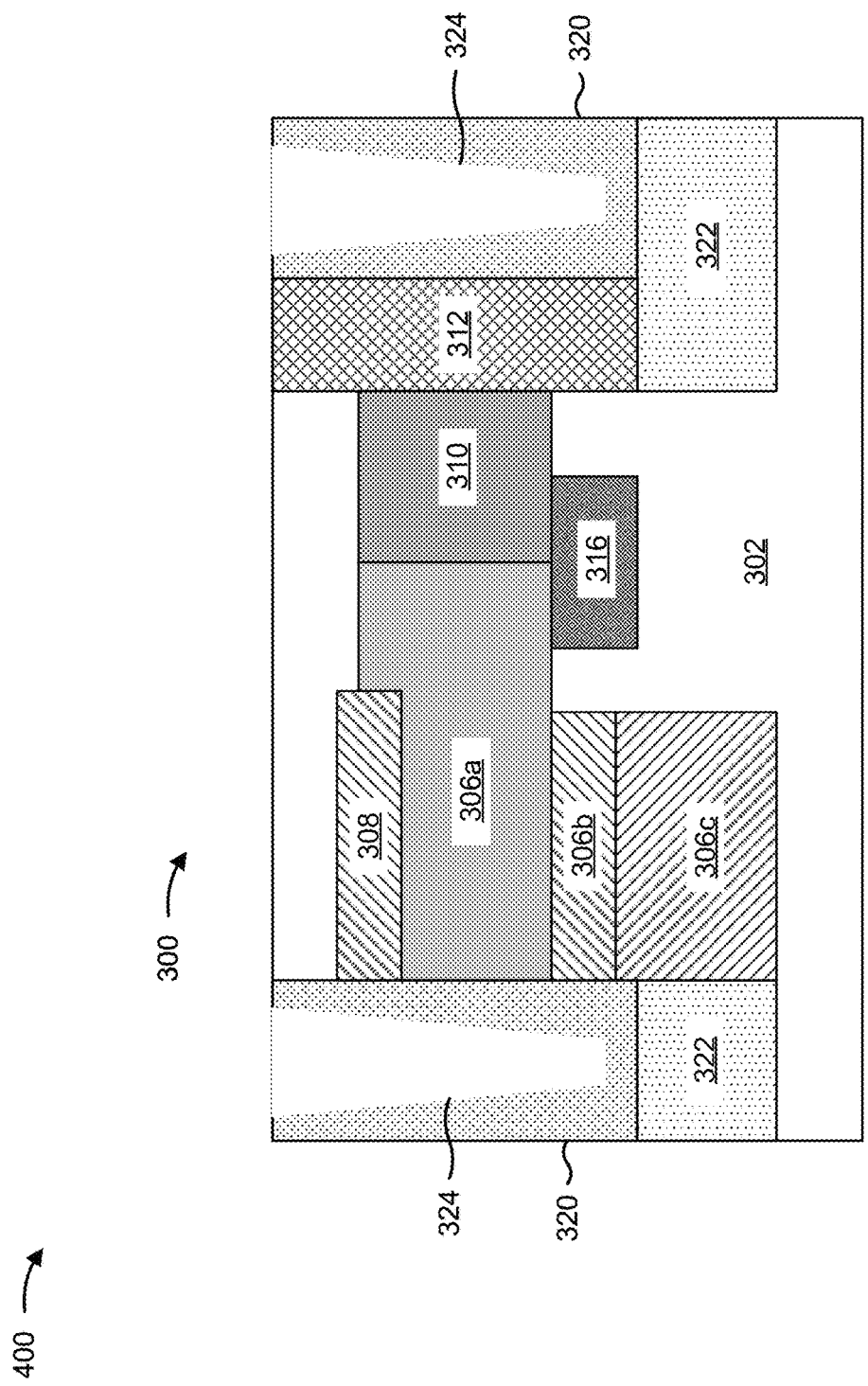
Figure 4G:
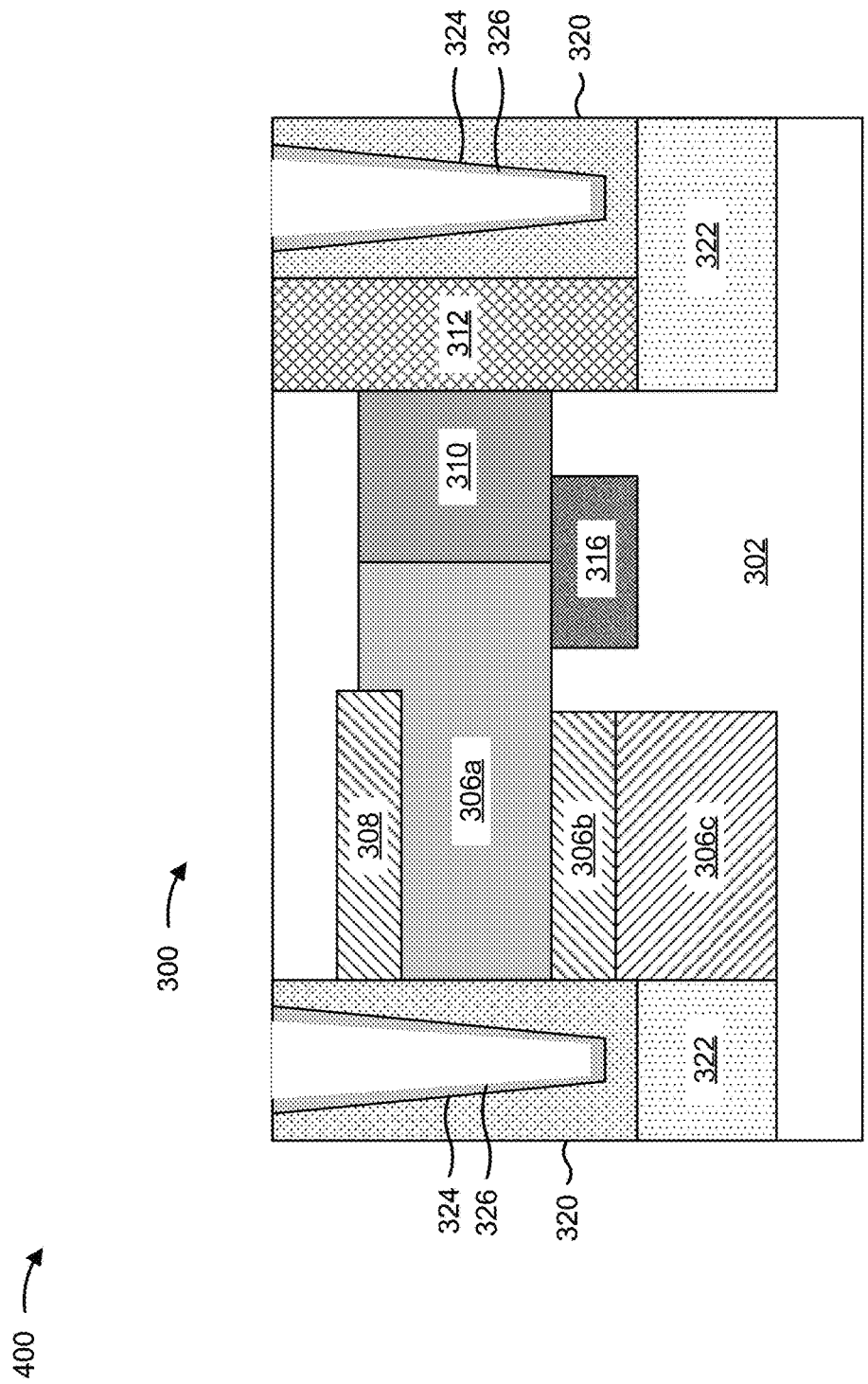
Figure 4H:
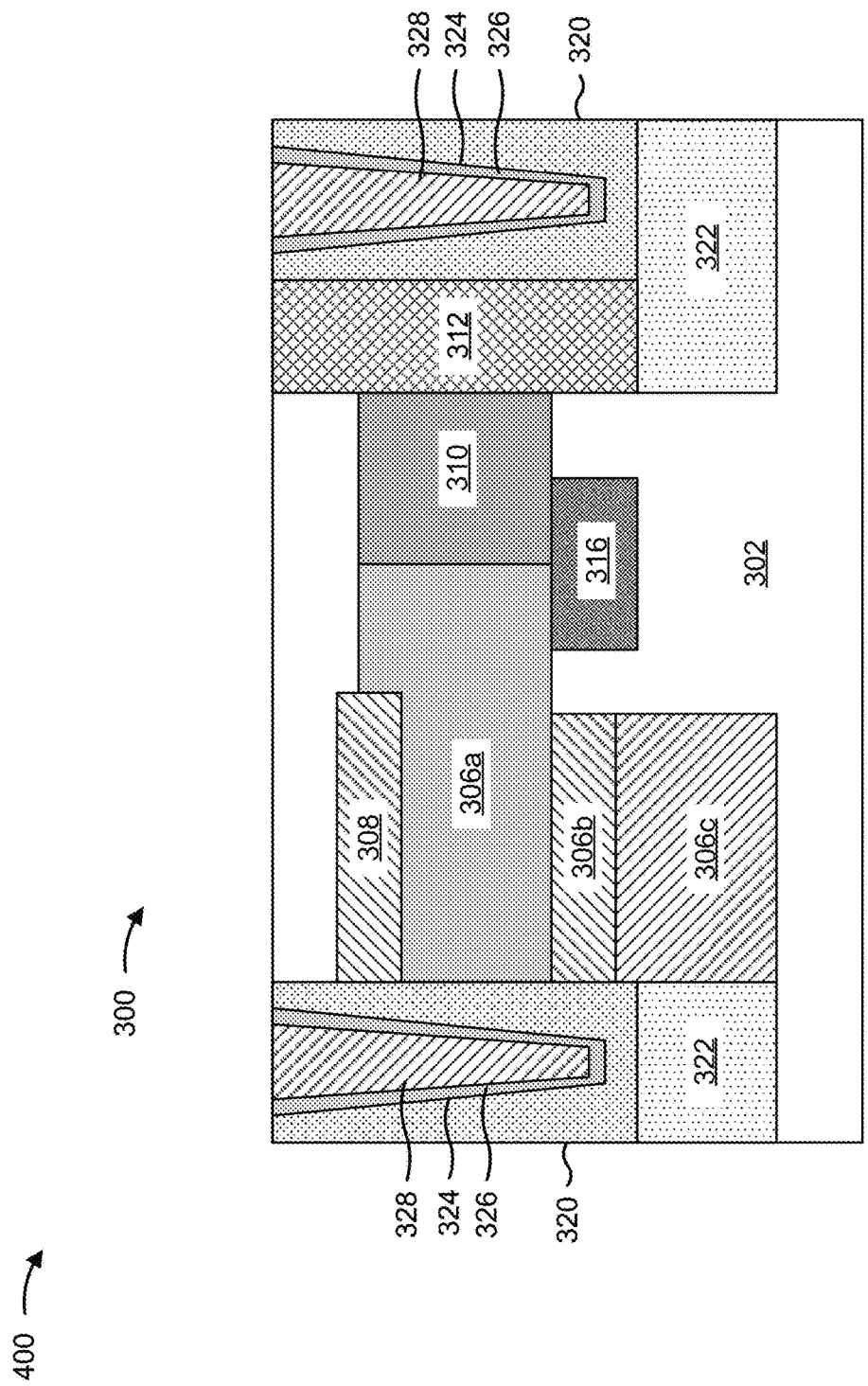
Figure 4I:
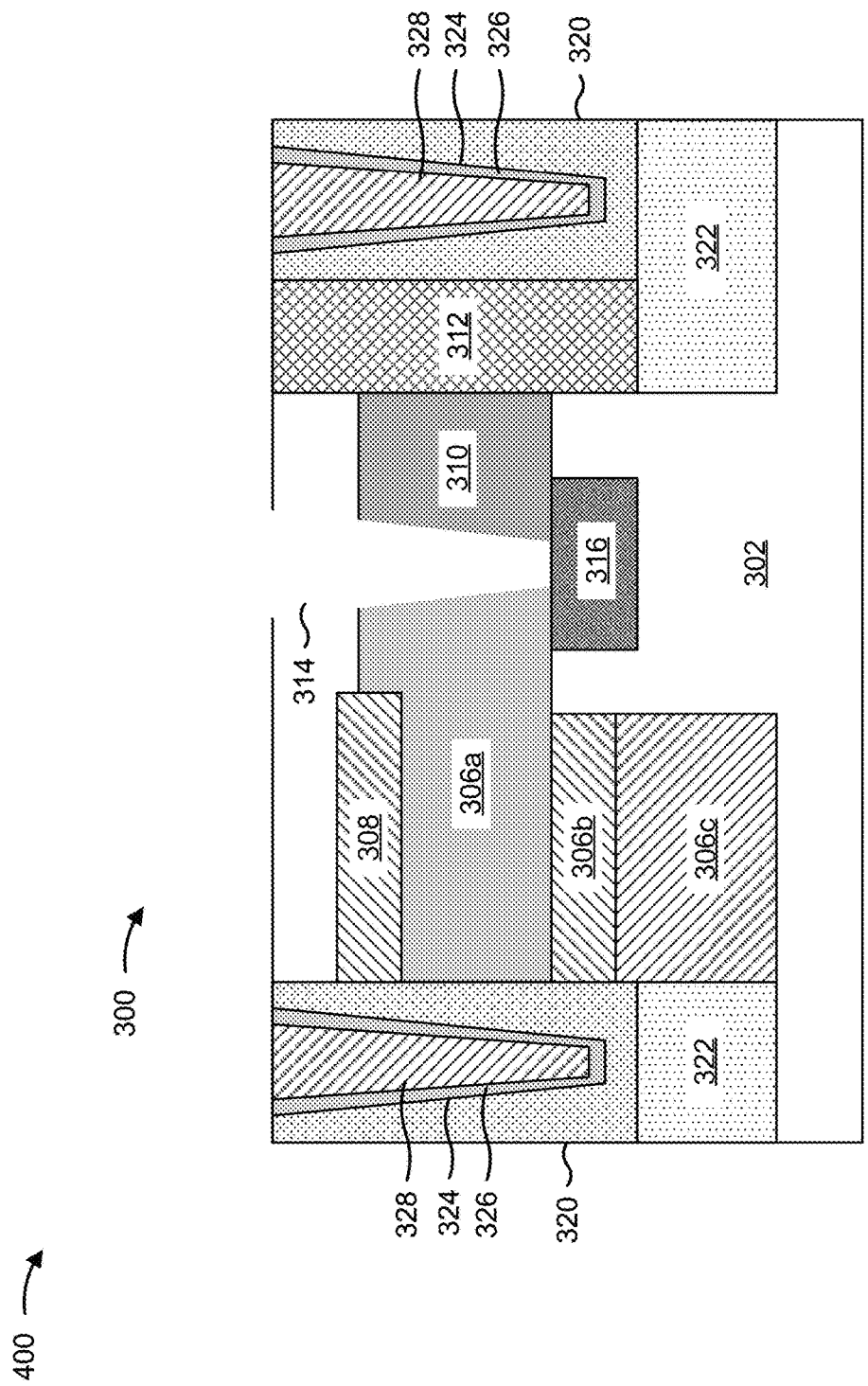
Figure 4J:
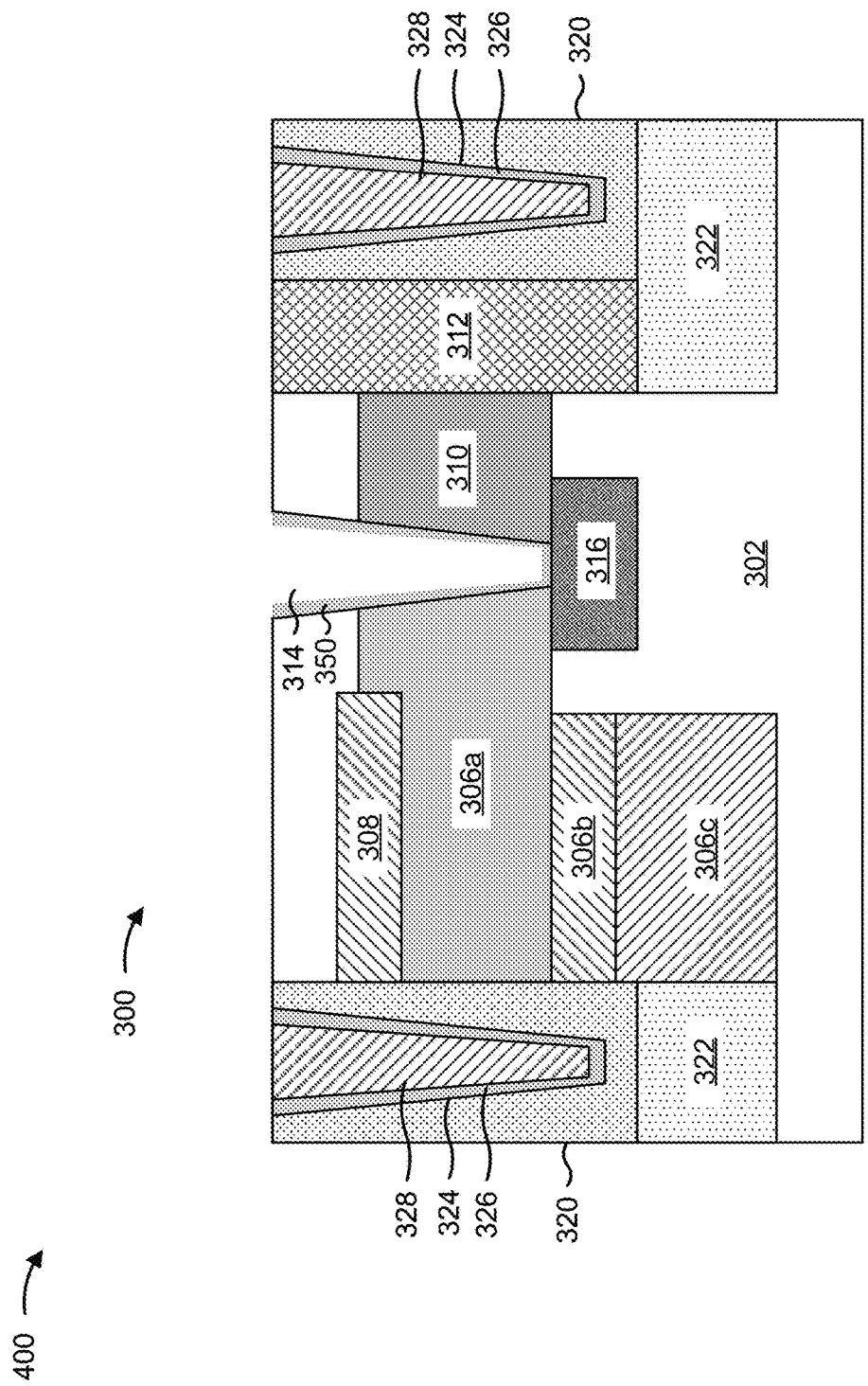
Figure 4K:
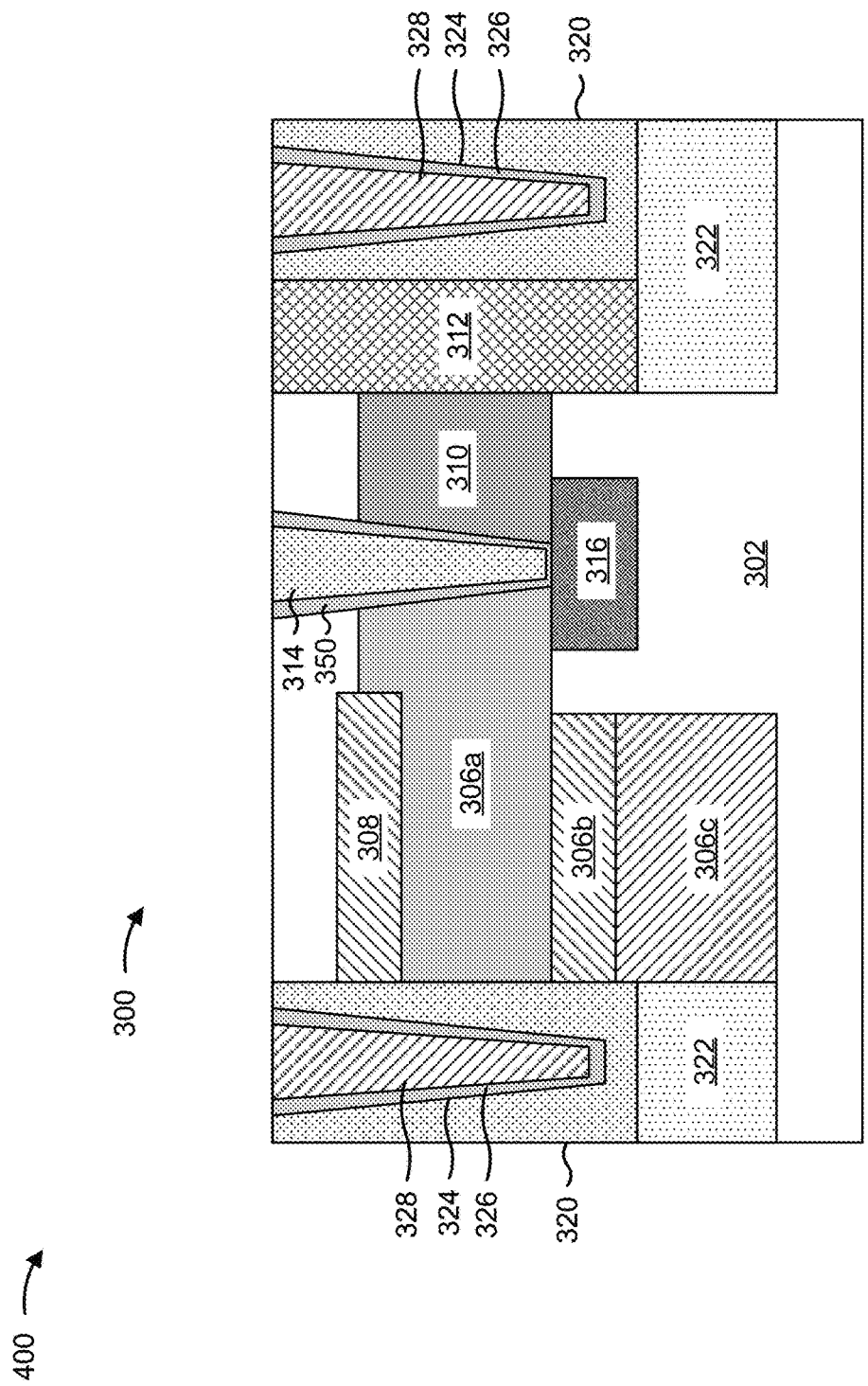
Figure 4L:
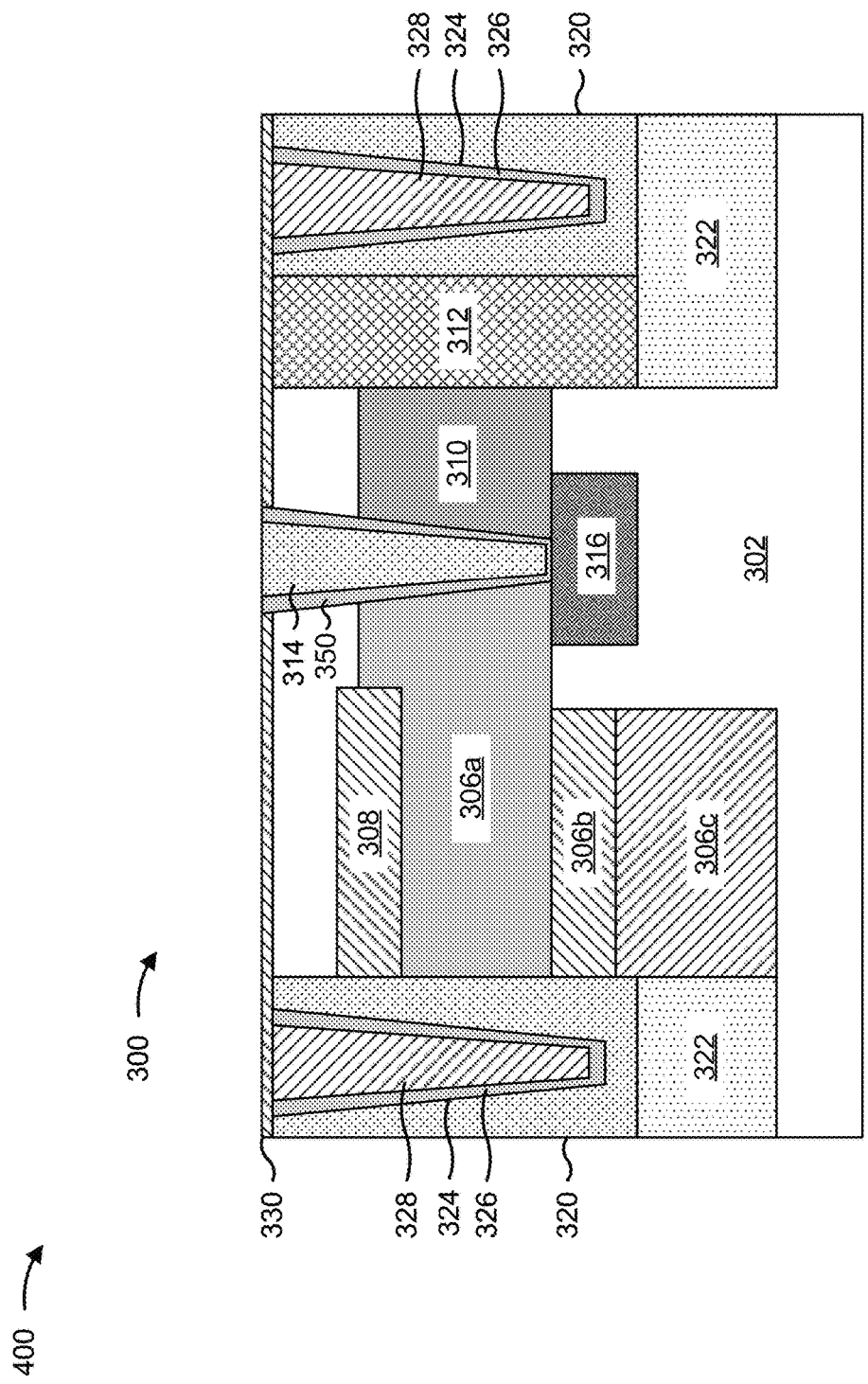
Figure 4M:
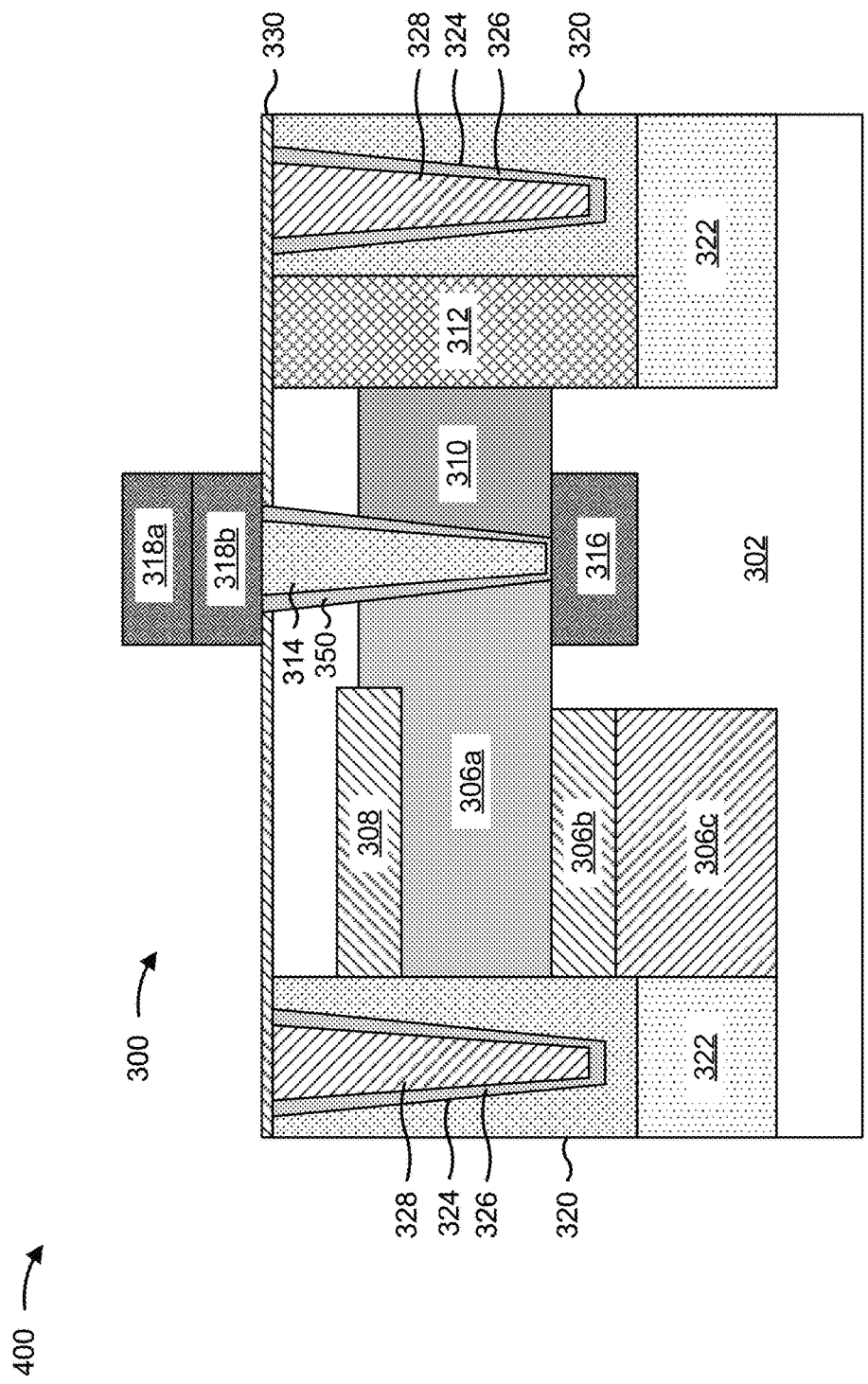
Figure 4N:
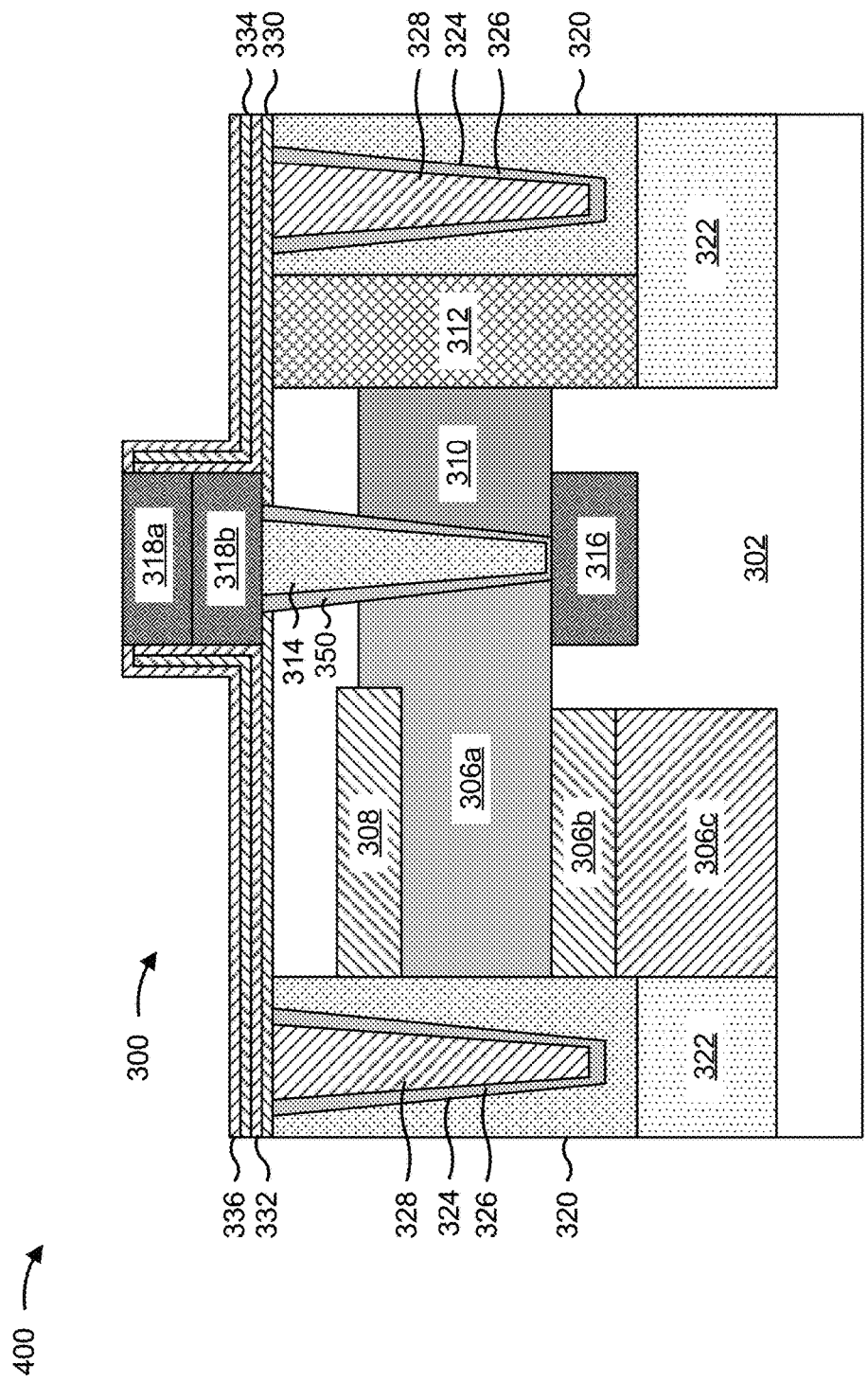
Figure 4O:
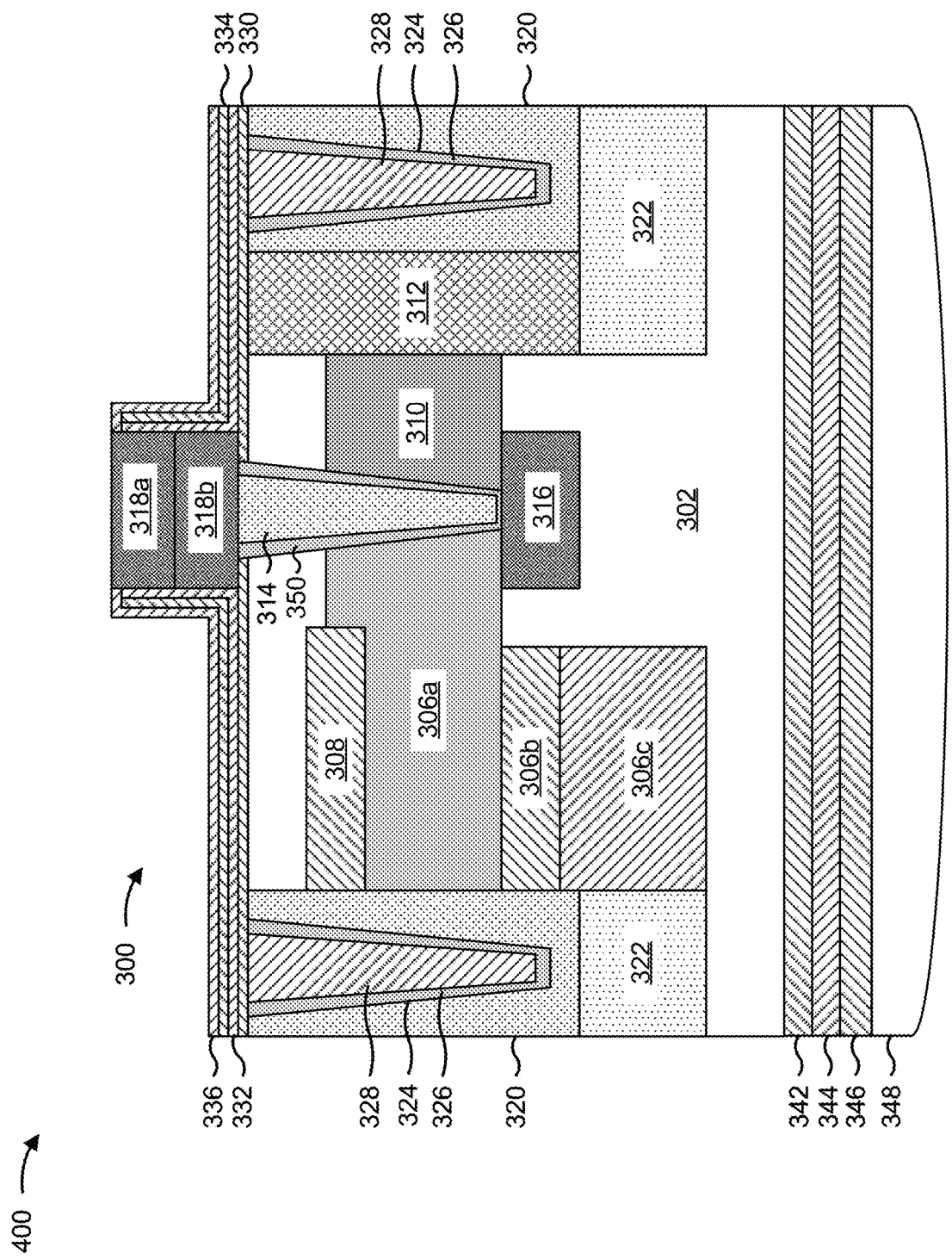
Figure 4P:
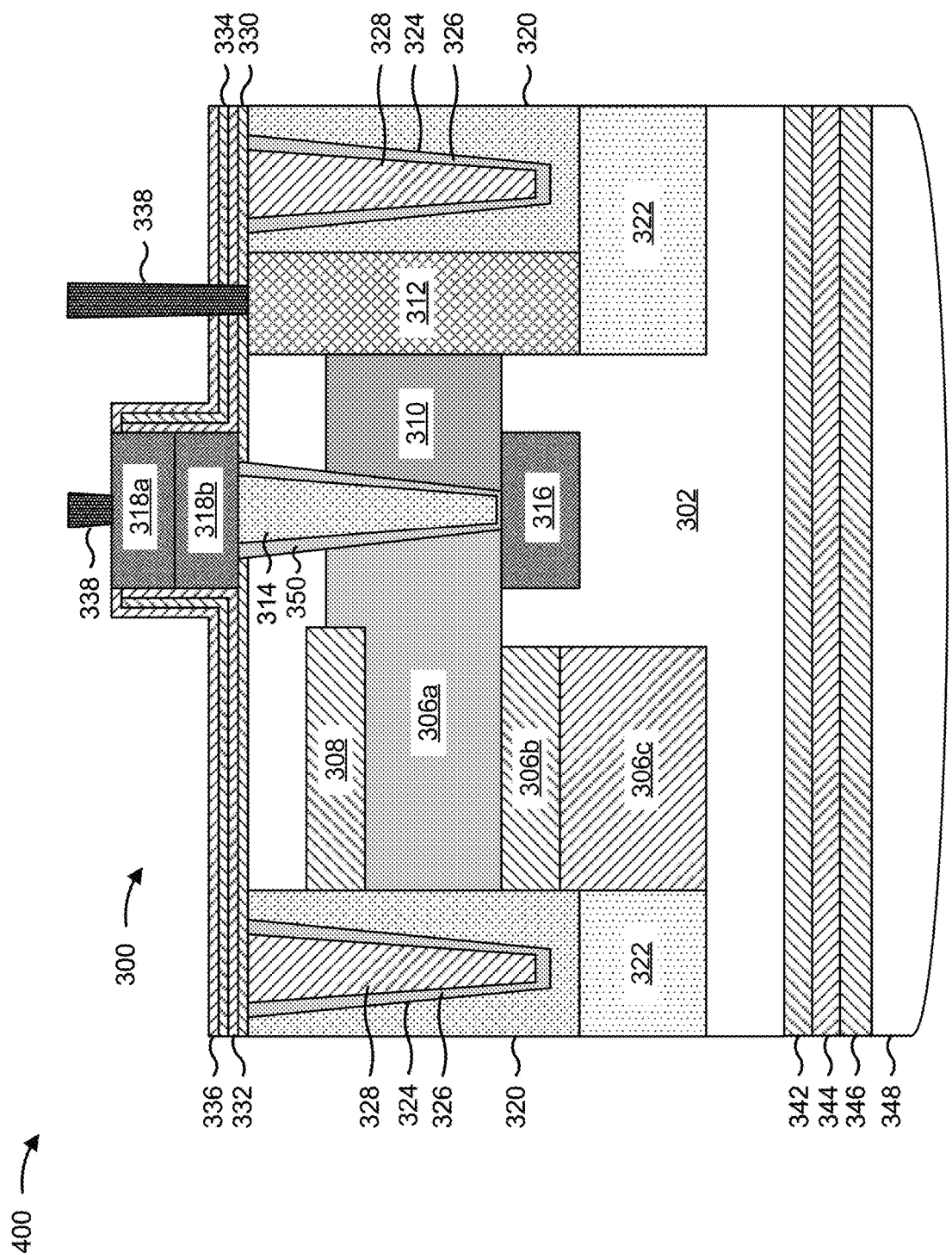
Figure 4Q:
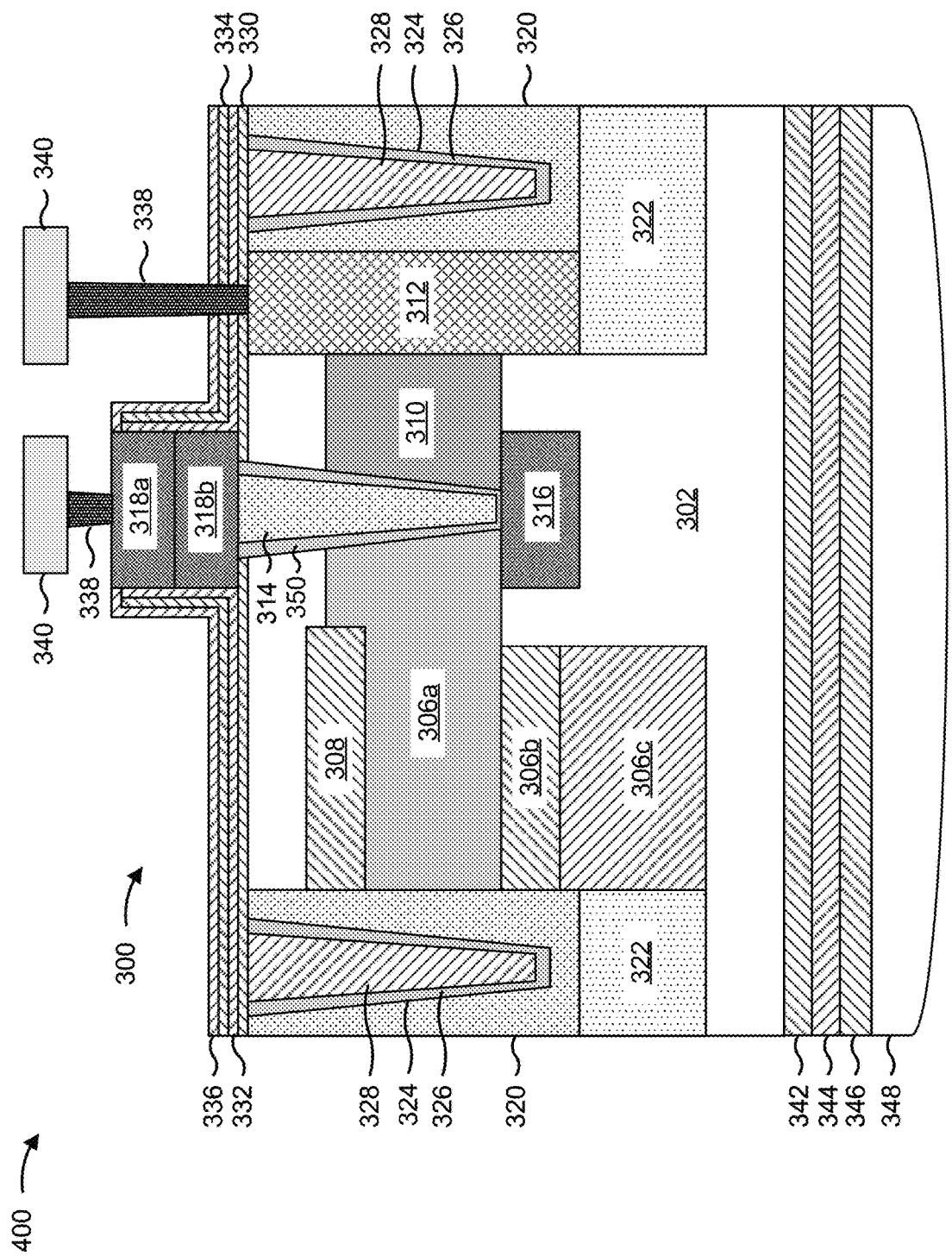

FIGS. 4A-4Q are diagrams of an example implementation 400 described herein. Example implementation 400 may be an example process for forming the pixel sensor 300. The process includes a cleaning process and/or an implantation process to cause formation of silicon-fluorine bonds in an interface between a transfer gate contact of the pixel sensor 300 and a substrate of the pixel sensor 300. The silicon-fluorine bonds reduce dark current in the pixel sensor 300.

In some implementations, the example techniques and procedures described in connection with FIGS. 4A-4Q may be used in connection with other pixel sensors described herein. As shown in FIG. 4A, the example process for forming the pixel sensor 300 may be performed in connection with the substrate 302.

As shown in FIG. 4B, the cell p-well region (CPW) 320 and the deep p-well region (DPW) 322 may be formed in the substrate 302. For example, the deep p-well region 322 may be formed (e.g., as a circle or ring shape in a top-down view) in the substrate 302, and the cell p-well region 320 may be formed (e.g., as a circle or ring shape in a top-down view) in the substrate 302 above and/or over the deep p-well region 322 to provide electrical isolation and/or optical isolation for the pixel sensor 300. In some implementations, the ion implantation tool 114 dopes the substrate 302 by ion implantation to form the cell p-well region 320 and the deep p-well region 322. For example, the ion implantation tool 114 may implant p$^+$ ions into a first region of the substrate 302 to form the deep p-well region 322, and may implant p$^+$ ions into a second region of the substrate 302 to form the cell p-well region 320 above and/or over the deep p-well region 322. In some implementations, the substrate 302 may be doped using another doping technique such as diffusion to form the cell p-well region 320 and/or the deep p-well region 322. In some implementations, the substrate 302 may be doped with different p$^+$ dopant concentrations to form the cell p-well region 320 and/or the deep p-well region 322.

As shown in FIG. 4C, the substrate 302 may be doped to form the p-type region 316. The ion implantation tool 114 may dope the substrate 302 to form the p-type region 316. The ion implantation tool 114 may implant p$^+$ ions into the substrate 302 to form the p-type region 316. In some implementations, the p-type region 316 of the substrate 302 may be doped using another doping technique such as diffusion. The ion implantation tool 114 may form the p-type region 316 within the perimeter of the cell p-well region 320 and/or within the perimeter of the deep p-well region 322.

As shown in FIG. 4D, a plurality of regions of the substrate 302 may be doped to form one or more n-type regions 306b and 306c, and to form the drain region 312. In some implementations, the ion implantation tool 114 dopes the plurality of regions of the substrate 302 by one or more ion implantation operations. For example, the ion implantation tool 114 may implant n$^+$ ions in the substrate 302 to form the n-type region 306c, may implant n$^+$ ions in the substrate 302 to form the n-type region 306b above and/or over the n-type region 306c, and may implant n$^+$ ions in the substrate 302 to form the drain region 312 above and/or over the deep p-well region 322. The ion implantation tool 114 may form the n-type region 306b and the n-type region 306c adjacent to the cell p-well region 320 and the deep p-well region 322 such that the n-type region 306b and the n-type region 306c are located within the perimeter of the cell p-well region 320 and the deep p-well region 322. The ion implantation tool 114 may form the drain region 312 adjacent to the cell p-well region 320 such that the drain region 312 is located within the perimeter of the cell p-well region 320. In some implementations, the plurality of regions of the substrate 302 may be doped using another doping technique such as diffusion. In some implementations, the n-type region 306b and the n-type region 306c may be doped with different n-type dopant concentrations.

As shown in FIG. 4E, a plurality of regions of the substrate 302 may be doped to form the n-type region 306a and the drain extension region 310. In some implementations, the ion implantation tool 114 dopes the plurality of regions of the substrate 302 by one or more ion implantation operations. For example, the ion implantation tool 114 may implant n$^+$ ions in the substrate 302 to form the n-type region 306a, and may implant n$^+$ ions in the substrate 302 to form the drain extension region 310. The ion implantation tool 114 may form the n-type region 306a above and/or over the n-type region 306b, and within the perimeter of the cell p-well region 320. The ion implantation tool 114 may form the drain extension region 310 adjacent to the n-type region 306a and the drain region 312, and within the perimeter of the cell p-well region 320. In some implementations, the plurality of regions of the substrate 302 may be doped using another doping technique such as diffusion. In some implementations, the n-type region 306a, the n-type region 306b, and/or the n-type region 306c may be doped with different n-type dopant concentrations. In some implementations, the drain extension region 310 and the drain region 312 may be doped with different n-type dopant concentrations.

As further shown in FIG. 4E, the substrate 302 may be doped to form the p-type region 308. The ion implantation tool 114 may dope the substrate 302 to form the p-type region 308 above and/or over at least a portion of the n-type region 306a. The ion implantation tool 114 may implant p⁺ ions into the substrate 302 to form the p-type region 308. In some implementations, the plurality of regions of the substrate 302 may be doped using another doping technique such as diffusion. The ion implantation tool 114 may form the p-type region 308 within the perimeter of the cell p-well region 320.

As shown in FIG. 4F, the cell p-well region 320 may be etched to form the isolation structure 324 such that the isolation structure 324 surrounds the one or more n-type regions 306, the p-type region 308, the drain extension region 310, the drain region 312, and the p-type region 316. The deposition tool 102 may form a photoresist layer on the substrate 302 and on the cell p-well region 320, the exposure tool 104 may expose the photoresist layer to a radiation source to pattern the photoresist layer, the developer tool 106 may develop and remove portions of the photoresist layer to expose the pattern, and the etch tool 108 may etch portions of the cell p-well region 320 to form the isolation structure 324. The etch tool 108 may etch the isolation structure 324 down into the cell p-well region 320 from a top surface of the cell p-well region 320. In some implementations, a photoresist removal tool removes the remaining portions of the photoresist layer (e.g., using a chemical stripper, a plasma asher, and/or another technique) after the etch tool 108 etches the cell p-well region 320.

As shown in FIG. 4G, the isolation structure 324 may be lined with the field implant layer (FIL) 326. In some implementations, the field implant layer 326 may be formed by doping the cell p-well region 320 with p⁺ ions to increase the p-type dopant concentration along the sidewalls and the bottom surface of the isolation structure 324. For example, the ion implantation tool 114 may dope the sidewalls and the bottom surface of the isolation structure 324 with a p-type dopant to form the field implant layer 326. In some implementations, the field implant layer 326 is formed by epitaxial growth on the sidewalls and the bottom surface of the isolation structure 324. In these examples, the field implant layer 326 may be formed with or without in situ doping during the epitaxial growth.

In some implementations, the ion implantation tool 114 uses fluorine in combination with the p⁺ ions. For example, the ion implantation tool 114 may use fluorine in combination with boron to dope the sidewalls and the bottom surface of the isolation structure 324, which causes formation of silicon-fluorine bonds at an interface between the isolation structure 324 and the substrate 302. Additionally, or alternatively, the ion implantation tool 114 uses fluorine to perform a cleaning operation before doping the isolation structure 324 with p⁺ ions. For example, the ion implantation tool 114 may use a fluorine plasma to remove impurities from the isolation structure 324 as well as cause formation of silicon-fluorine bonds at an interface between the isolation structure 324 and the substrate 302. The silicon-fluorine bonds at the interface at least partially fill unoccupied band gaps, which reduces dark current originating at the interface.

As shown in FIG. 4H, the oxide layer 328 may be filled in the isolation structure 324 above and/or over the field implant layer 326. The deposition tool 102 may deposit the oxide layer 328 by a CVD technique, a PVD technique, an ALD technique, or another type of deposition technique. The planarization tool 110 may planarize the oxide layer 328 after the oxide layer 328 is deposited in the isolation structure 324.

As shown in FIG. 4I, the substrate 302 may be etched to form the transfer gate contact 314 above and/or over the p-type region 316, and between the n-type region 306a and the drain extension region 310. The deposition tool 102 may form a photoresist layer on the substrate 302, the exposure tool 104 may expose the photoresist layer to a radiation source to pattern the photoresist layer, the developer tool 106 may develop and remove portions of the photoresist layer to expose the pattern, and the etch tool 108 may etch portions of the substrate 302 to form the transfer gate contact 314. The etch tool 108 may etch the transfer gate contact 314 down into the substrate 302 from a top surface of the substrate 302. In some implementations, a photoresist removal tool removes the remaining portions of the photoresist layer (e.g., using a chemical stripper, a plasma asher, and/or another technique) after the etch tool 108 etches the substrate 302. The transfer gate contact 314 may be formed such that the transfer gate contact 314 extends to the top surface of the substrate 302, as shown in FIG. 4I.

In some implementations, the transfer gate contact 314 is doped with p⁺ ions to increase the p-type dopant concentration along the sidewalls and the bottom surface of the transfer gate contact 314. For example, the ion implantation tool 114 may dope the sidewalls and the bottom surface of the isolation structure 324 with a p-type dopant to form the field implant layer 326.

In some implementations, the ion implantation tool 114 uses fluorine in combination with the p⁺ ions. For example, the ion implantation tool 114 may use fluorine in combination with boron to dope the sidewalls and the bottom surface of the transfer gate contact 314, which causes formation of silicon-fluorine bonds at an interface between the transfer gate contact 314 and the substrate 302. Additionally, or alternatively, the ion implantation tool 114 uses fluorine to perform a cleaning operation before doping the transfer gate contact 314 with p⁺ ions. For example, the ion implantation tool 114 may use a fluorine plasma to remove impurities from the transfer gate contact 314 as well as cause formation of silicon-fluorine bonds at an interface between the transfer gate contact 314 and the substrate 302. The silicon-fluorine bonds at the interface at least partially fill unoccupied band gaps, which reduces dark current originating at the interface.

The fluorine concentration may be in a range of approximately $10^{11}$ ions per square centimeter ($cm^2$) to approximately $10^{13}$ ions per $cm^2$. By selecting a concentration of at least $10^{11}$ ions per $cm^2$, the dark current is reduced. Selecting a concentration of less than $10^{13}$ ions per $cm^2$ may prevent oversaturation with fluorine. Preventing oversaturation prevents the electronegativity of fluorine from resulting in a new source of dark current.

In some implementations, a ratio of a concentration of fluorine located at the interface to a concentration of boron located at the interface is selected based on a threshold voltage associated with the transfer gate contact 314 and a saturation current associated with the floating diffusion region drain extension region 310 and a drain region 312. For example, the ratio may be selected such that the threshold voltage and/or the saturation current are approximately equal to a corresponding threshold voltage and/or corresponding saturation current, respectively, of a pixel sensor that does not include fluorine. Accordingly, the concentration of boron may be increased to compensate for the electronegativity of fluorine, such that the concentration of boron is increased as the concentration of fluorine is increased.

As shown in FIG. 4J, the gate transfer contact 314 may be lined with the oxide layer 350. In some implementations, the deposition tool 102 deposits the oxide layer 350 using a CVD technique, a PVD technique, an ALD technique, or another type of deposition technique. In some implementations, the oxide 350 is formed by epitaxial growth on the sidewalls and the bottom surface of the gate transfer contact 314.

As shown in FIG. 4K, the gate transfer contact 314 may be filled with polysilicon. The deposition tool 102 may deposit the polysilicon by a CVD technique, a PVD technique, an ALD technique, or another type of deposition technique. The planarization tool 110 may planarize the polysilicon after deposition in the gate transfer contact 314.

As shown in FIG. 4L, the gate dielectric layer 330 may be formed above and/or over the top surface of the substrate 302, and above and/or over the cell p-well region 320. The deposition tool 102 may deposit the gate dielectric layer 330 using a CVD technique, a PVD technique, an ALD technique, or another type of deposition technique. The planarization tool 110 may planarize the gate dielectric layer 330 after the gate dielectric layer 330 is deposited.

As shown in FIG. 4M, the transfer gate electrode 318b may be formed over and/or on the gate dielectric layer 330, and coupled to the transfer gate contact 314. The n-doped upper transfer gate electrode region 318a may be formed over and/or on the transfer gate electrode 318b. In some implementations, the deposition tool 102 deposits the n-doped upper transfer gate electrode region 318a and/or the transfer gate electrode 318b using a CVD technique, a PVD technique, an ALD technique, or another type of deposition technique; the plating tool 112 deposits the n-doped upper transfer gate electrode region 318a and/or the transfer gate electrode 318b using an electroplating operation; or a combination thereof. In some implementations, the ion implantation tool 114 forms the n-doped upper transfer gate electrode region 318a and/or the transfer gate electrode 318b using one or more ion implantation operations. In some implementations, the planarization tool 110 planarizes the n-doped upper transfer gate electrode region 318a and/or the transfer gate electrode 318b after formation of the n-doped upper transfer gate electrode region 318a and/or the transfer gate electrode 318b.

As shown in FIG. 4N, the sidewall oxide layer 332 may be formed over and/or on the gate dielectric layer 330, on the sidewalls of the n-doped upper transfer gate electrode region 318a, and on the sidewalls of the transfer gate electrode 318b. The deposition tool 102 may deposit the sidewall oxide layer 332 using a CVD technique, a PVD technique, an ALD technique, or another type of deposition technique. The planarization tool 110 may planarize the sidewall oxide layer 332 after the sidewall oxide layer 332 is deposited.

As further shown in FIG. 4N, the remote plasma oxide (RPO) layer 334 may be formed over and/or on the sidewall oxide layer 332, over the sidewalls of the n-doped upper transfer gate electrode region 318a, and over the sidewalls of the transfer gate electrode 318b. The deposition tool 102 may deposit the remote plasma oxide layer 334 using a CVD technique, a PVD technique, an ALD technique, or another type of deposition technique. The planarization tool 110 may planarize the remote plasma oxide layer 334 after the remote plasma oxide layer 334 is deposited.

As further shown in FIG. 4N, the contact etch stop layer (CESL) 336 may be formed over and/or on the remote plasma oxide layer 334, over the sidewalls of the n-doped upper transfer gate electrode region 318a, and over the sidewalls of the transfer gate electrode 318b. The deposition tool 102 may deposit the contact etch stop layer 336 using a CVD technique, a PVD technique, an ALD technique, or another type of deposition technique. The planarization tool 110 may planarize the contact etch stop layer 336 after the contact etch stop layer 336 is deposited.

As shown in FIG. 4O, back side processing may be performed on the pixel sensor 300 to form the $p^+$ ion layer 342, the ARC 344, the color filter layer 346, and the micro-lens layer 348 over the back side or the bottom side of the substrate 302. The deposition tool 102 may deposit the $p^+$ ion layer 342, the ARC 344, the color filter layer 346, and the micro-lens layer 348 using a CVD technique, a PVD technique, an ALD technique, or another type of deposition technique. The $p^+$ ion layer 342 may be formed over and/or on the substrate 302. The ARC 344 may be formed over and/or on the $p^+$ ion layer 342. The color filter layer 346 may be formed over and/or on the ARC 344. The micro-lens layer 348 may be formed over and/or on the color filter layer 346. The planarization tool 110 may planarize the $p^+$ ion layer 342, the ARC 344, and the color filter layer 346.

As shown in FIG. 4P, the interconnects 338 may be formed (e.g., in a dielectric layer above the substrate 302). A first interconnect 338 may be formed such that the first interconnect 338 contacts the n-doped upper transfer gate electrode region 318a. A second interconnect 338 may be formed such that the second interconnect 338 contacts the drain region 312. The deposition tool 102 may deposit the material of the interconnects 338 using a CVD technique, a PVD technique, an ALD technique, or another type of deposition technique, the plating tool 112 may deposit the material of the interconnects 338 using an electroplating operation, or a combination thereof. The planarization tool 110 may planarize the interconnects 338 after the interconnects 338 are deposited.

As shown in FIG. 4Q, the metallization layer 340 may be formed (e.g., over and/or on a dielectric layer or an IMD layer) such that the metallization layer 340 contacts the interconnects 338. The deposition tool 102 may deposit the material of the metallization layer 340 using a CVD technique, a PVD technique, an ALD technique, or another type of deposition technique, the plating tool 112 may deposit the material of the metallization layer 340 using an electroplating operation, or a combination thereof. The planarization tool 110 may planarize the metallization layer 340 after the metallization layer 340 is deposited.

As indicated above, FIGS. 4A-4Q are provided as an example. Other examples may differ from what is described with regard to FIGS. 4A-4Q.

Figure 5:
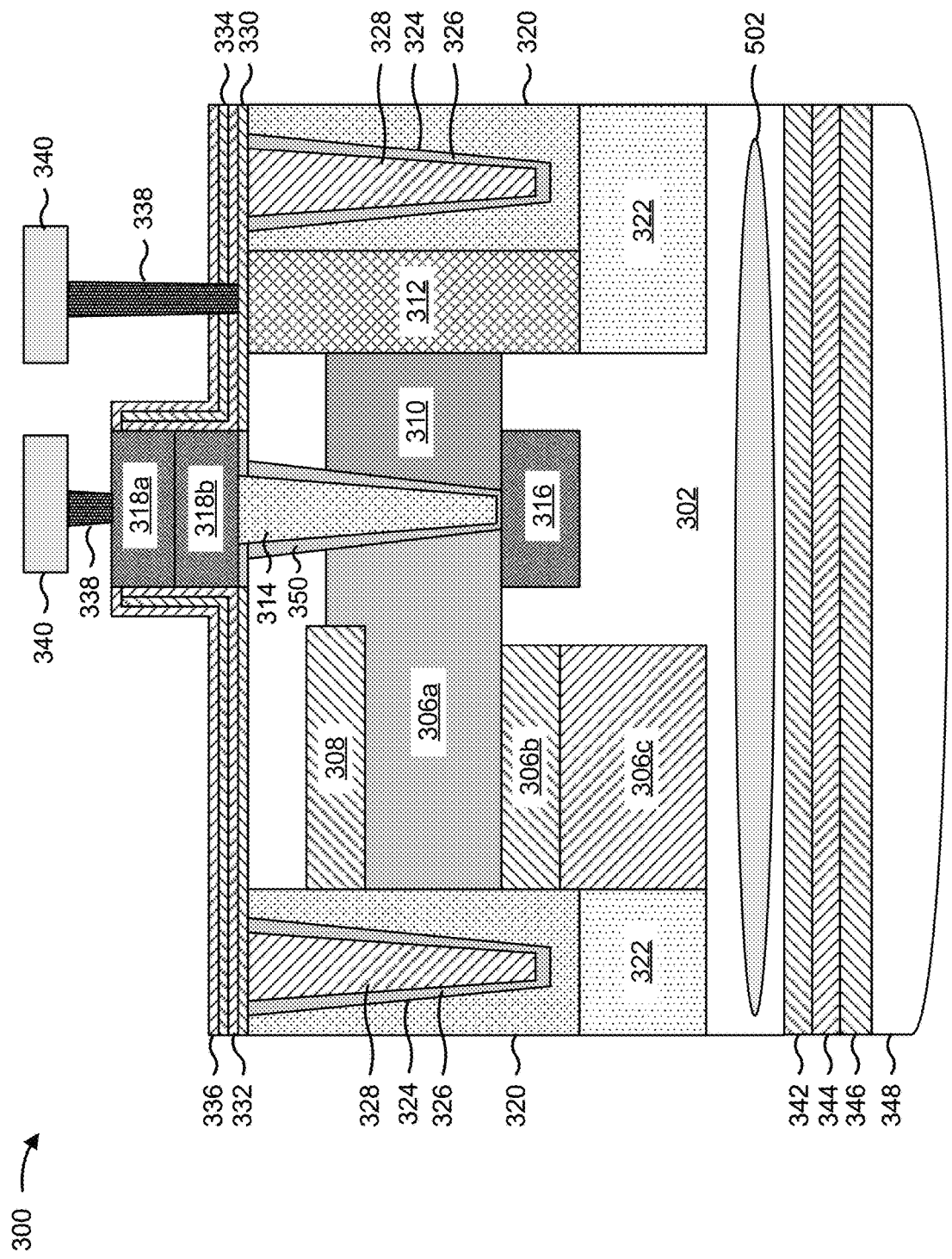
FIG. 5 is a diagram of an example pixel sensor described herein.

FIG. 5 is a diagram of another example of the pixel sensor 300 described herein. FIG. 5 includes a cross-section view of the pixel sensor 300. As shown in FIG. 5, the pixel sensor 300 includes a similar arrangement of components and/or structures shown in FIGS. 3A-3C. In addition, the pixel sensor 300 includes a deep n-type region 502, which may be referred to as an axial deep n-well or an array deep n-well (ADNW). The deep n-type region 502 may be included in the substrate 302 between the $p^+$ ion layer 342 and the photodiode 304. The deep n-type region 502 further facilitates the absorption of photons and the migration of electrons through the photodiode 304. In some implementations, the deep n-type region 502 may span across a plurality of pixel sensors (e.g., an array of pixel sensors) including the pixel sensor 300.

As indicated above, FIG. 5 is provided as an example. Other examples may differ from what is described with regard to FIG. 5.

Figure 6:
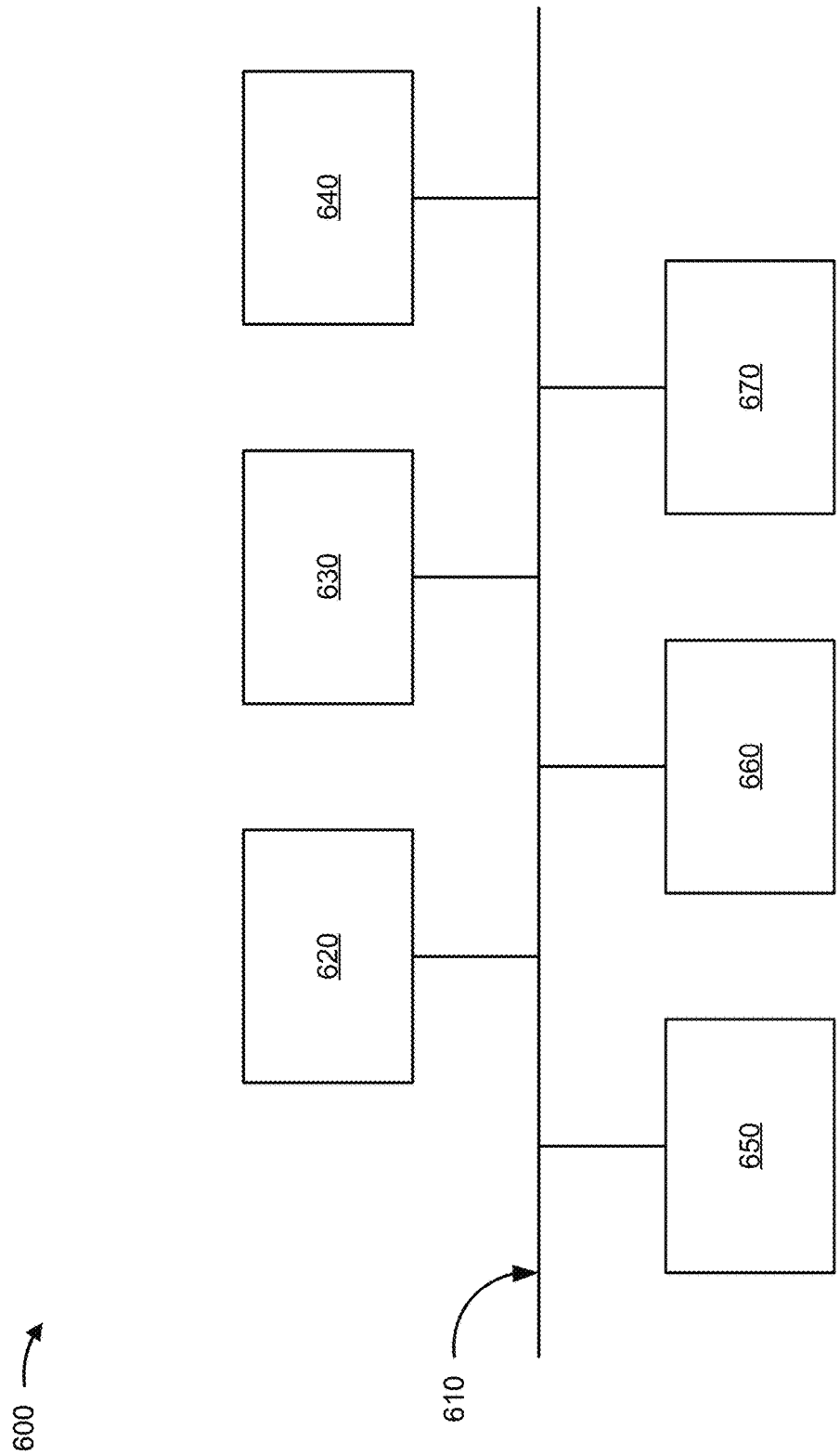
FIG. 6 is a diagram of example components of one or more devices of FIG. 1.

FIG. 6 is a diagram of example components of a device 600. In some implementations, one or more of the semiconductor processing tools 102-114 and/or the wafer/die transport tool 116 may include one or more devices 600 and/or one or more components of device 600. As shown in FIG. 6, device 600 may include a bus 610, a processor 620, a memory 630, a storage component 640, an input component 650, an output component 660, and a communication component 670.

Bus 610 includes a component that enables wired and/or wireless communication among the components of device 600. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware or a combination of hardware and software. In some implementations, processor 620 includes one or more processors capable of being programmed to perform a function. Memory 630 includes a random access memory, a read only memory, and/or another type of memory (e.g., a flash memory, a magnetic memory, and/or an optical memory).

Storage component 640 stores information and/or software related to the operation of device 600. For example, storage component 640 may include a hard disk drive, a magnetic disk drive, an optical disk drive, a solid state disk drive, a compact disc, a digital versatile disc, and/or another type of non-transitory computer-readable medium. Input component 650 enables device 600 to receive input, such as user input and/or sensed inputs. For example, input component 650 may include a touch screen, a keyboard, a keypad, a mouse, a button, a microphone, a switch, a sensor, a global positioning system component, an accelerometer, a gyroscope, and/or an actuator. Output component 660 enables device 600 to provide output, such as via a display, a speaker, and/or one or more light-emitting diodes. Communication component 670 enables device 600 to communicate with other devices, such as via a wired connection and/or a wireless connection. For example, communication component 670 may include a receiver, a transmitter, a transceiver, a modem, a network interface card, and/or an antenna.

Device 600 may perform one or more processes described herein. For example, a non-transitory computer-readable medium (e.g., memory 630 and/or storage component 640) may store a set of instructions (e.g., one or more instructions, code, software code, and/or program code) for execution by processor 620. Processor 620 may execute the set of instructions to perform one or more processes described herein. In some implementations, execution of the set of instructions, by one or more processors 620, causes the one or more processors 620 and/or the device 600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
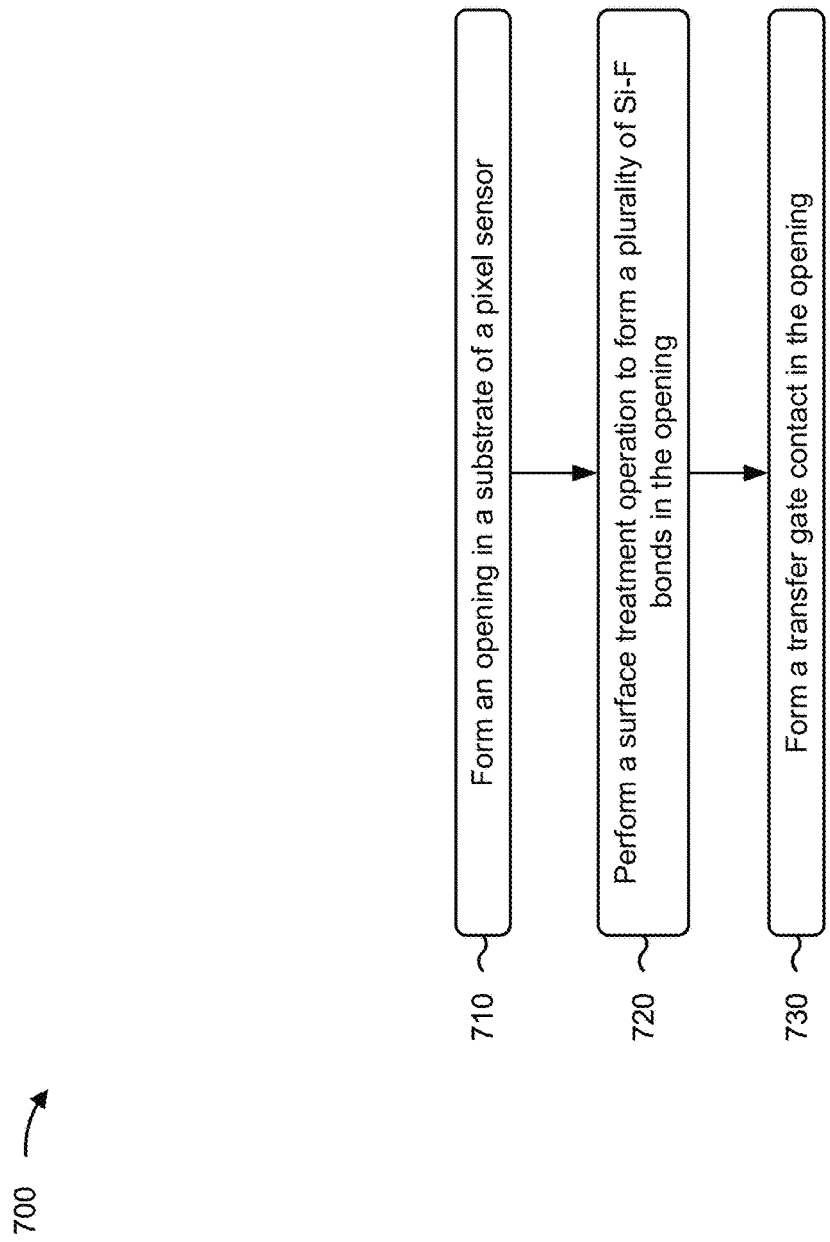
FIG. 7 is a flowchart of an example process relating to forming a semiconductor structure.

FIG. 7 is a flowchart of an example process 700 associated with fluorine passivation in a pixel sensor. In some implementations, one or more process blocks of FIG. 7 may be performed by a device (e.g., device 600). In some implementations, one or more process blocks of FIG. 7 may be performed by one or more semiconductor processing tools (e.g., one or more of the semiconductor processing tools 102-114). Additionally, or alternatively, one or more process blocks of FIG. 7 may be performed by one or more components of device 600, such as processor 620, memory 630, storage component 640, input component 650, output component 660, and/or communication component 670.

As shown in FIG. 7, process 700 may include forming an opening in a substrate of a pixel sensor (block 710). For example, the one or more semiconductor processing tools 102-114 may form, in the substrate 302 of the pixel sensor 300, an opening or a trench, as described above.

As further shown in FIG. 7, process 700 may include performing a surface treatment operation to form a first plurality of silicon-fluorine bonds along a bottom surface of the opening and along sidewalls of the opening (block 720). For example, the one or more semiconductor processing tools 102-114 may perform a surface treatment operation to form a first plurality of silicon-fluorine bonds along a bottom surface of the opening and along sidewalls of the opening, as described above.

As further shown in FIG. 7, process 700 may include forming a transfer gate contact in the opening after performing the surface treatment operation (block 730). For example, the one or more semiconductor processing tools 102-114 may form a transfer gate contact 314 in the opening after performing the surface treatment operation, as described above.

Process 700 may include additional implementations, such as any single implementation or any combination of implementations described below and/or in connection with one or more other processes described elsewhere herein.

In a first implementation, performing the surface treatment operation includes performing a cleaning operation using fluorine. In a second implementation, alone or in combination with the first implementation, performing the surface treatment operation includes performing a fluorine implantation operation before formation of an oxide liner 350 in the opening.

In a third implementation, alone or in combination with one or more of the first and second implementations, a fluorine concentration at the bottom surface is greater relative to a fluorine concentration at the sidewalls. In a fourth implementation, alone or in combination with one or more of the first through third implementations, performing the surface treatment operation includes performing a fluorine implantation operation during implantation of a p-type material in the opening.

In a fifth implementation, alone or in combination with one or more of the first through fourth implementations, the surface treatment operation is a first surface treatment operation, and process 700 includes forming an STI structure 324 in the substrate 302 and performing a second surface treatment operation to form a second plurality of silicon-fluorine bonds at an interface between the STI structure 324 and the substrate 302. In a sixth implementation, alone or in combination with one or more of the first through fifth implementations, performing the second surface treatment operation includes performing a fluorine implantation operation before filling the STI structure 324 with an oxide material 328. In a seventh implementation, alone or in combination with one or more of the first through sixth implementations, performing the second surface treatment operation comprises performing a fluorine implantation operation during implantation of a p-type material in the STI structure 324.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

In this way, implementations described herein reduce electron-hole pair generation due to silicon dangling bonds in pixel sensors. In some implementations, the silicon dangling bonds in a pixel sensor may be passivated by silicon-fluorine (Si—F) bonding in various portions of the pixel sensor such as a VTG or an STI region, among other examples. The silicon-fluorine bonds are formed by fluorine implantation and/or another type of semiconductor processing operation. In some implementations, the silicon-fluorine bonds are formed as part of a cleaning operation using fluorine (F) such that the fluorine may bond with the silicon of the pixel sensor. Additionally, or alternatively, the silicon-fluorine bonds are formed as part of a doping operation in which boron (B) and/or another p-type doping element is used with fluorine such that the fluorine may bond with the silicon of the pixel sensor. As a result, the silicon-fluorine bond passivation increases performance of a pixel array under dark pixel and/or white pixel conditions without increasing the complexity of forming and/or processing the pixel array. As an example, the silicon-fluorine bond passivation may reduce dark current of the pixel array by approximately 13% or greater, may reduce DSNU of the pixel array by approximately 25% or greater, and/or may reduce white pixels in the pixel array by approximately 20% or greater.

As described in greater detail above, some implementations described herein provide a pixel sensor. The pixel sensor includes a substrate. The pixel sensor further includes a photodiode region in the substrate and a floating diffusion region in the substrate. The pixel sensor further includes a transfer gate contact in the substrate between the photodiode region and the floating diffusion region. The pixel sensor includes a first plurality of silicon-fluorine bonds located at an interface between the transfer gate contact and the substrate.

As described in greater detail above, some implementations described herein provide a method. The method includes forming an opening in a substrate of a pixel sensor. The method further includes performing a surface treatment operation to form a first plurality of silicon-fluorine bonds along a bottom surface of the opening and along sidewalls of the opening. The method further includes forming a transfer gate contact in the opening after performing the surface treatment operation.

As described in greater detail above, some implementations described herein provide a semiconductor structure. The semiconductor structure includes a substrate including a trench, where a bottom surface of the trench and sidewalls of the trench include a plurality of silicon-fluorine bonds. The semiconductor structure further includes an oxide layer that lines the trench and contacts a photodiode region and a floating diffusion region. The semiconductor structure further includes a polysilicon layer filling the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a drain region and a drain extension region in a substrate of a pixel sensor;
    forming an opening in the substrate;
    performing a surface treatment operation to form a first plurality of silicon-fluorine bonds along a bottom surface of the opening and along sidewalls of the opening; and
    forming a transfer gate contact in the opening after performing the surface treatment operation,
        wherein, in a cross-section view of the pixel sensor:
            the drain region extends beyond the transfer gate contact in the substrate, and
            the drain extension region and the transfer gate contact extend to a same depth in the substrate.

2. The method of claim 1, wherein performing the surface treatment operation comprises:
    performing a cleaning operation using fluorine.

3. The method of claim 1, wherein performing the surface treatment operation comprises:
    performing a fluorine implantation operation before formation of an oxide liner in the opening.

4. The method of claim 1, wherein a fluorine concentration at the bottom surface is greater relative to a fluorine concentration at the sidewalls.

5. The method of claim 1, wherein performing the surface treatment operation comprises:
    performing a fluorine implantation operation during implantation of a p-type material in the opening.

6. The method of claim 1, wherein the surface treatment operation is a first surface treatment operation, and
    wherein the method further comprises:
        forming a shallow trench isolation (STI) structure in the substrate; and
        performing a second surface treatment operation to form a second plurality of silicon-fluorine bonds at an interface between the STI structure and the substrate.

7. The method of claim 6, wherein performing the second surface treatment operation comprises:
    performing a fluorine implantation operation before filling the STI structure with an oxide material.

8. The method of claim 6, wherein performing the second surface treatment operation comprises:
    performing a fluorine implantation operation during implantation of a p-type material in the STI structure.

9. A method, comprising:
    forming a drain region and a drain extension region in a substrate of a pixel sensor, wherein the drain extension region is adjacent to the drain region;
    forming a photodiode region in the substrate;
    forming a floating diffusion region in the substrate;
    forming a transfer gate contact in the substrate between the photodiode region and the floating diffusion region,
        wherein, in a cross-section view of the pixel sensor:
            the drain extension region of the pixel sensor extends beyond the transfer gate contact in the substrate, and
            the drain extension region and the transfer gate contact extend to a same depth in the substrate; and forming a first plurality of silicon-fluorine bonds at an interface between the transfer gate contact and the substrate.

10. The method of claim 9, wherein an angle between a bottom surface of the transfer gate contact and a sidewall of the transfer gate contact is in a range of approximately 70 degrees to approximately 90 degrees.

11. The method of claim 9, wherein a ratio between a depth of the transfer gate contact to a width of the transfer gate contact is in a range of approximately 3 to approximately 6.

12. The method of claim 9, further comprising:
forming a shallow trench isolation (STI) structure adjacent to the floating diffusion region; and
forming a second plurality of silicon-fluorine bonds located at an interface between the STI structure and the substrate.

13. The method of claim 9, wherein a ratio of a concentration of fluorine located at the interface to a concentration of boron located at the interface is based on a threshold voltage associated with the transfer gate contact and a saturation current associated with the floating diffusion region.

14. The method of claim 9, wherein a size of the pixel sensor is in a range of approximately 0.1 micrometers (μm) to 1.0 μm.

15. The method of claim 9, further comprising:
forming an oxide layer between the interface and the transfer gate contact.

16. The method of claim 15, wherein a thickness of the oxide layer is in a range of approximately 1 Ångström to approximately 96 Ångströms.

17. A method of forming a pixel sensor, comprising:
forming an oxide layer that lines a trench of a substrate and that contacts a floating diffusion region, wherein a bottom surface of the trench and sidewalls of the trench include a plurality of silicon-fluorine bonds, wherein:
the floating diffusion region includes a drain region and a drain extension region, wherein the drain extension region is adjacent to the drain extension region, and
in a cross-section view of the pixel sensor:
the drain extension region of the pixel sensor extends beyond the trench in the substrate, and
the drain extension region and the trench extend to a same depth in the substrate; and
forming a polysilicon layer in the trench.

18. The method of claim 17, wherein a fluorine concentration associated with the trench is in a range of approximately $10^{11}$ ions per square centimeter (cm2) to approximately $10^{13}$ ions per cm2.

19. The method of claim 17, wherein a bottom surface and sidewalls of the trench are implanted with boron atoms.

20. The method of claim 17, wherein the silicon-fluorine bonds are located within a range of approximately 0 nanometers (nm) to approximately 500 nm beneath a surface of the trench.

* * * * *